(12) United States Patent
Hsu et al.

(10) Patent No.: US 8,487,696 B2
(45) Date of Patent: Jul. 16, 2013

(54) MODULARIZED THREE-DIMENSIONAL CAPACITOR ARRAY

(75) Inventors: Louis L. Hsu, Fishkill, NY (US); Xu Ouyang, Hopewell Junction, NY (US); Chih-Chao Yang, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/438,230

(22) Filed: Apr. 3, 2012

(65) Prior Publication Data
US 2012/0188002 A1  Jul. 26, 2012

Related U.S. Application Data

(62) Division of application No. 12/565,802, filed on Sep. 24, 2009, now Pat. No. 8,188,786.

(51) Int. Cl.
*G01R 31/28* (2006.01)
*H03K 17/687* (2006.01)

(52) U.S. Cl.
USPC ............ 327/581; 327/590; 307/131; 324/548

(58) Field of Classification Search
None
See application file for complete search history.

(56) References Cited

U.S. PATENT DOCUMENTS

| | | |
|---|---|---|
| 4,583,404 A | 4/1986 | Bernard et al. |
| 4,803,598 A | 2/1989 | Efford et al. |
| 4,972,370 A | 11/1990 | Morimoto et al. |
| 5,125,138 A | 6/1992 | Shaw et al. |
| 5,460,007 A | 10/1995 | Reed et al. |
| 5,523,619 A | 6/1996 | McAllister et al. |
| 5,817,543 A | 10/1998 | McAllister et al. |
| 5,843,025 A | 12/1998 | Shaari |
| 5,880,921 A | 3/1999 | Tham et al. |
| 5,886,430 A | 3/1999 | Ralson et al. |
| 6,208,501 B1 | 3/2001 | Ingalls et al. |
| 6,225,133 B1 | 5/2001 | Yamamichi et al. |
| 6,230,566 B1 | 5/2001 | Lee et al. |
| 6,242,911 B1 | 6/2001 | Maschek |
| 6,307,250 B1 | 10/2001 | Krauter et al. |
| 6,377,438 B1 | 4/2002 | Deane et al. |
| 6,556,416 B2 | 4/2003 | Kunihiro |
| 6,674,383 B2 | 1/2004 | Horsley et al. |

(Continued)

OTHER PUBLICATIONS

Jow, U et al., "Functional Embedded RF Circuits on Multi-Layer Printed Wiring Board (PWB) Process" Electronic Components and technology Conference (May 31-Jun. 3, 2005) pp. 1634-1641.

(Continued)

*Primary Examiner* — Lincoln Donovan
*Assistant Examiner* — Terry L Englund
(74) *Attorney, Agent, or Firm* — Scully, Scott, Murphy & Presser, P.C.; Joseph Petrokaitis, Esq.

(57) ABSTRACT

A modularized capacitor array includes a plurality of capacitor modules. Each capacitor module includes a capacitor and a switching device that is configured to electrically disconnect the capacitor. The switching device includes a sensing unit configured to detect the level of leakage of the capacitor so that the switching device disconnects the capacitor electrically if the leakage current exceeds a predetermined level. Each capacitor module can include a single capacitor plate, two capacitor plates, or more than two capacitor plates. The leakage sensors and switching devices are employed to electrically disconnect any capacitor module of the capacitor array that becomes leaky, thereby protecting the capacitor array from excessive electrical leakage.

18 Claims, 16 Drawing Sheets

U.S. PATENT DOCUMENTS

| | | | |
|---|---|---|---|
| 6,844,771 B1* | 1/2005 | Chen | 327/379 |
| 6,933,873 B1 | 8/2005 | Horsley et al. | |
| 7,268,632 B2 | 9/2007 | Bonaccio et al. | |
| 7,342,434 B2* | 3/2008 | Wakayama et al. | 327/530 |
| 7,385,800 B2 | 6/2008 | Morris, III et al. | |
| 7,391,213 B2 | 6/2008 | Watkins et al. | |
| 7,750,511 B2 | 7/2010 | Agarwal et al. | |
| 7,821,053 B2 | 10/2010 | Barrows et al. | |
| 8,009,398 B2* | 8/2011 | Agarwal et al. | 361/56 |
| 2002/0054532 A1 | 5/2002 | Ooishi et al. | |
| 2002/0093446 A1 | 7/2002 | Horsley et al. | |
| 2003/0103301 A1* | 6/2003 | Fechner | 361/15 |
| 2003/0202395 A1 | 10/2003 | Lee et al. | |
| 2004/0220468 A1 | 11/2004 | Watkins et al. | |
| 2006/0203421 A1 | 9/2006 | Morris, III et al. | |
| 2008/0136557 A1 | 6/2008 | Hangai et al. | |
| 2008/0247572 A1 | 10/2008 | Langereis et al. | |
| 2009/0040857 A1 | 2/2009 | McNeil et al. | |
| 2011/0019321 A1 | 1/2011 | Chen et al. | |

OTHER PUBLICATIONS

Kwak, H. et al., "Plate Orientation Effect on the Inductance of Multi-Layer Ceramic Capacitors" Clemson Vehicular Electronics Laboratory, Department of Clemson University (Oct. 29-31, 2007) pp. 95-98.

Erdahl, D. et al., "Online -Offline Laser Ultrasonic Quality Inspection Tool for Multi-Layer Chip Capacitors" Georgia Institue of Technology (Aug. 2002) pp. 225-231.

Lee, S. et al., "Fabrication and Characterization of Embedded Capacitors in Printed Circuit Boards using B-Stage Epoxy/BaTiO3 Composite Embedded Capacitor Films (ECFs)" Electronic Components sand technology Conference (May 27-30, 2008) pp. 742-746.

Shim, H. et al., "Effect of Stitching and Decoupling Capacitors in the Split Power Distribution Network" Department of Electrical and Electronic Engineering, Yonsei University (Sep. 23-26, 2002).

Posada, G. et al., "Thin-Film MCM-D Technology with Through-Substrate Vias for the Integration of 3D SiP Modules" Electronic Components sand technology Conference ( May 27-30, 2008) pp. 2060-2066.

Berberich, S.E. et al., "High Voltage 3D-Capacitor" Fraunhofer Institute of Integrated Systems and Device Technology (IISB) (Sep. 2-5, 2007).

Benazzi, A. et al., "Performance of 3D Capacitors Integrated on Silicon for DC-DC Converter Applications" LAAS-CNRS, University of Toulouse (Sep. 2-5, 2007) pp. 1-9.

Skibinski, G. et al., "Use of Multi Layer Ceramic(MLC) Capacitors in High Power Converters" Allen Bradley Standard Drives Division ( Oct. 6-10, 1996) pp. 1319-1326.

Dimos, D. et al., "Direct-Write Fabrication of Integrated, Multilayer Passive Components" International Symposium on Advanced Packing Materials (Mar. 14-17, 1999) pp. 186-190.

\* cited by examiner

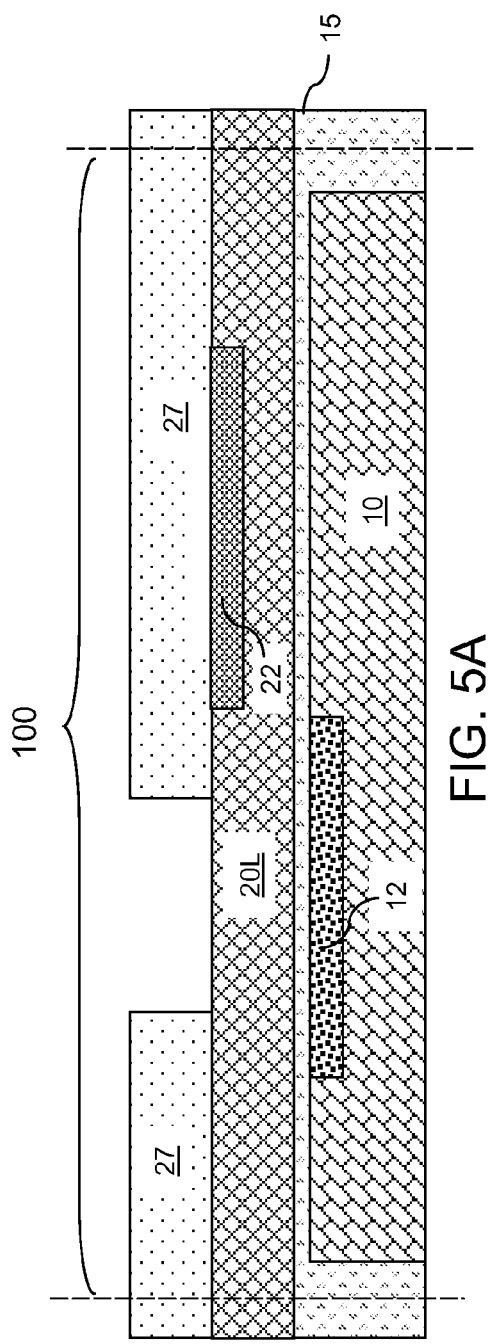
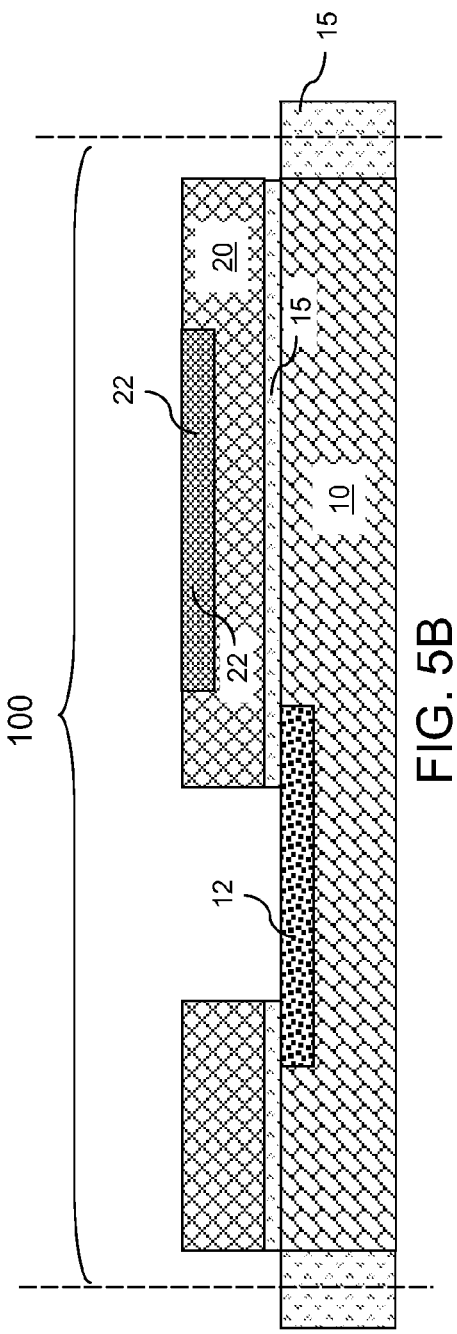
FIG. 5A
FIG. 5B

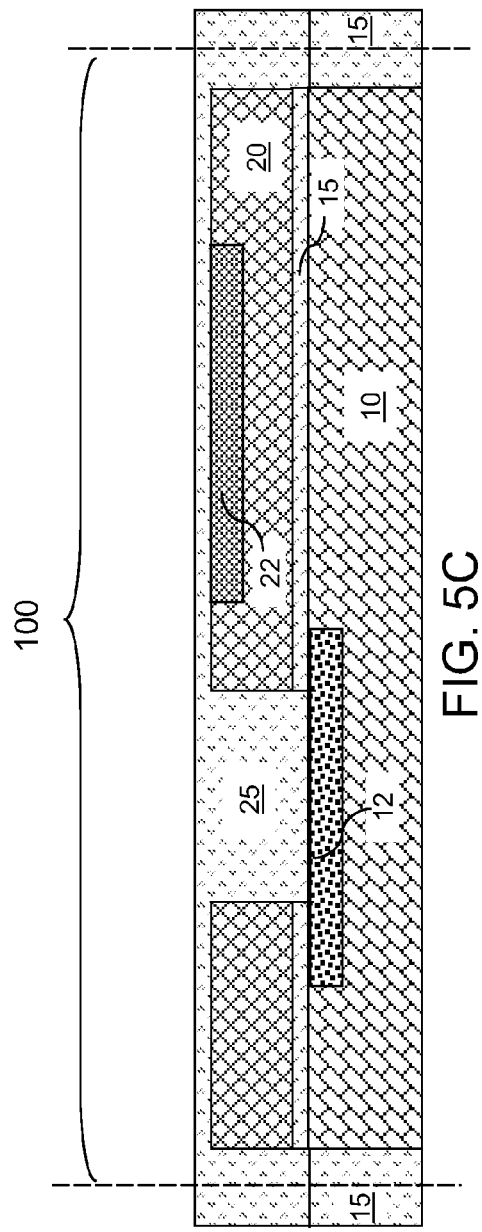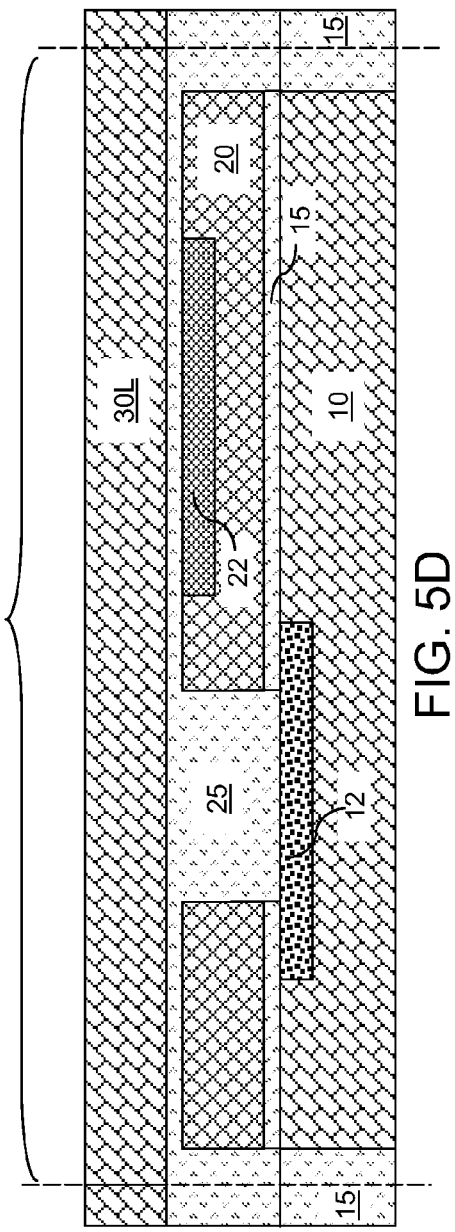

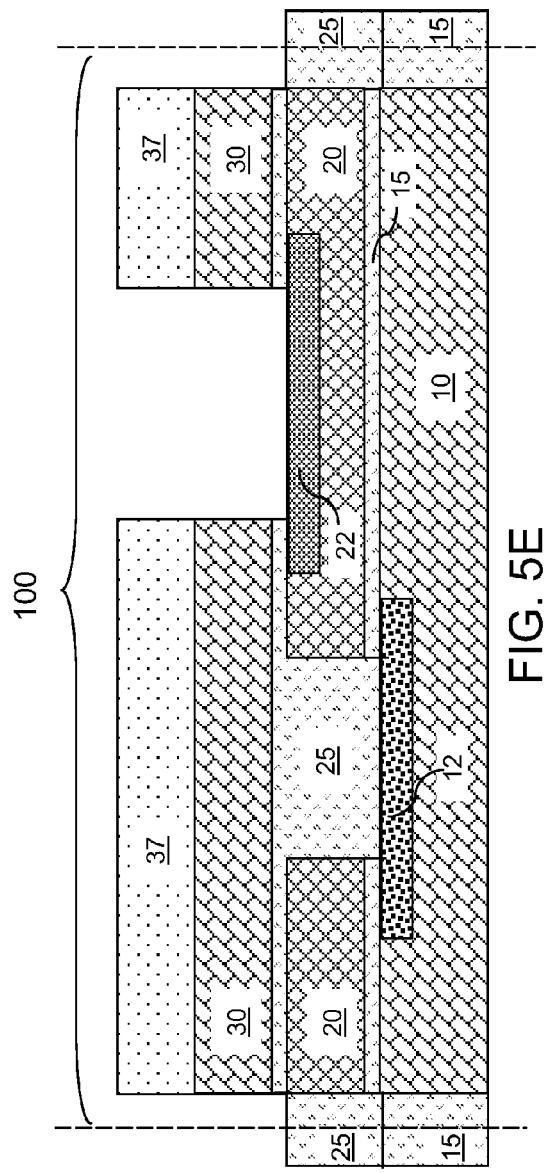
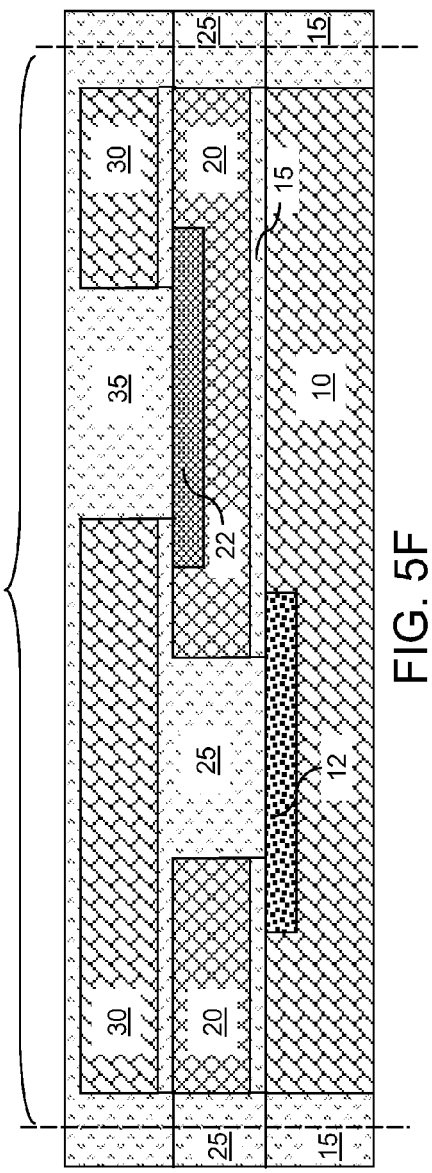

MODULARIZED THREE-DIMENSIONAL CAPACITOR ARRAY

CROSS REFERENCE TO RELATED APPLICATION

This application is a divisional of U.S. patent application Ser. No. 12/565,802, filed on Sep. 24, 2009 the entire content and disclosure of which is incorporated herein by reference.

BACKGROUND

The invention relates to the field of semiconductor devices and circuits, and particularly to a high-density, 3-dimensional microelectronic capacitor array, methods of manufacturing the same, and methods of operating the same.

Capacitors have found a wide range of applications in integrated semiconductor circuits. For example, high-density capacitors are employed to decouple and stabilize signal and power lines. As the number of integrated circuit components continuously increases from generation to generation, less chip area remains available for building passive devices such as capacitors.

Without a decoupling capacitor that provides sufficient capacitance, coupling noise can jeopardize signal integrity in high-speed circuits. Further, a large capacitor is needed for many circuits application including, for example, PLL (phase lock loop) circuits, charge pump circuits, analog circuits, and ESD (electro-static discharge) protection circuits.

To increase capacitance of a capacitor without a corresponding increase in circuit area used for the capacitor, some of the advanced semiconductor chips employ a thin node dielectric material for the capacitor. As the thickness of the node dielectric decreases, leakage current through the capacitor increases. The increase in the leakage current becomes a serious problem for a high-density capacitor because a leaky capacitor is electrically equivalent to a resistor in an unwanted place that reduces the supply voltage and increases power consumption of the circuit. Further, a leaky capacitor is known to cause a problem for many circuits. For example, a leaky capacitor is a major contributor to jitter noise in a PLL circuit.

BRIEF SUMMARY

According to an embodiment of the present invention, a modularized capacitor array includes a plurality of capacitor modules. Each capacitor module includes a capacitor and a switching device that is configured to electrically disconnect the capacitor. The switching device includes a sensing unit configured to detect the level of leakage of the capacitor so that the switching device disconnects the capacitor electrically if the leakage current exceeds a predetermined level. Each capacitor module can include a single capacitor plate, two capacitor plates, or more than two capacitor plates. The leakage sensors and switching devices are employed to electrically disconnect any capacitor module of the capacitor array that becomes leaky, thereby protecting the capacitor array from excessive electrical leakage.

The modularized construction of the capacitor array ensures that the yield of the capacitor array can be high despite local defects by disconnecting capacitor modules that leak excessively both at initial testing and during operation of a semiconductor chip in the field. Therefore, the granularity for electrical isolation of the capacitor module depends on the expected yield of each capacitor module. If the yield of each capacitor module is relatively poor, the granularity for electrical isolation of the capacitor module is high, and vice versa. Because high granularity for electrical isolation of the capacitor modules requires a large number of semiconductor devices for implementing the sensing units and switching devices, the degree of the granularity for electrical isolation of the capacitor module can be optimized by consideration the expected yield of each capacitor module and the area that the sensing units and switching devices require.

According to an aspect of the present invention, a semiconductor structure including an array of capacitor modules is provided. Each of the capacitor modules includes a capacitor and a switching device. The capacitor includes a first electrode, a second electrode, and a dielectric material located between the first electrode and the second electrode. The switching device is configured to electrically disconnect the capacitor from a power supply node.

According to another aspect of the present invention, a semiconductor structure including an array of vertically stacked capacitor modules is provided. Each of the vertically stacked capacitor modules includes at least two capacitors and at least one switching device. The at least two capacitors include at least three conductive plates that vertically overlie or underlie one another and are separated from one another by at least one node dielectric. The at least one switching device is configured to electrically disconnect the at least two capacitors from a power supply node.

According to yet another aspect of the present invention, a method of operating a semiconductor structure is provided. The method includes providing a semiconductor structure including an array of capacitor modules, wherein each of the capacitor modules includes a capacitor and a switching device connected to a power supply node; and turning on a first component of one of the switching devices within a capacitor module among the array of capacitor modules. A leakage current through a capacitor within the capacitor module triggers turning off of a second component within the capacitor module, whereby the capacitor within the capacitor module is electrically isolated from the power supply node.

According to still another aspect of the present invention, a method of manufacturing a semiconductor structure is provided. The method includes forming at least one switching device on a semiconductor substrate; forming at least one capacitor-side via structure contacting one node of the at least one switching device; and forming at least three conductive plates and at least one node dielectric on the semiconductor substrate. The at least three conductive plates vertically overlie or underlie one another and are separated from one another by the at least one node dielectric, and a laterally protruding portion of one of the at least three conductive plates contacts the at least one capacitor-side via structure.

BRIEF DESCRIPTION OF THE SEVERAL VIEWS OF THE DRAWINGS

FIGS. 5A-5K are sequential vertical cross-sectional views of a fourth exemplary structure during processing steps according to a fifth embodiment of the present invention.

DETAILED DESCRIPTION

Figure 1:
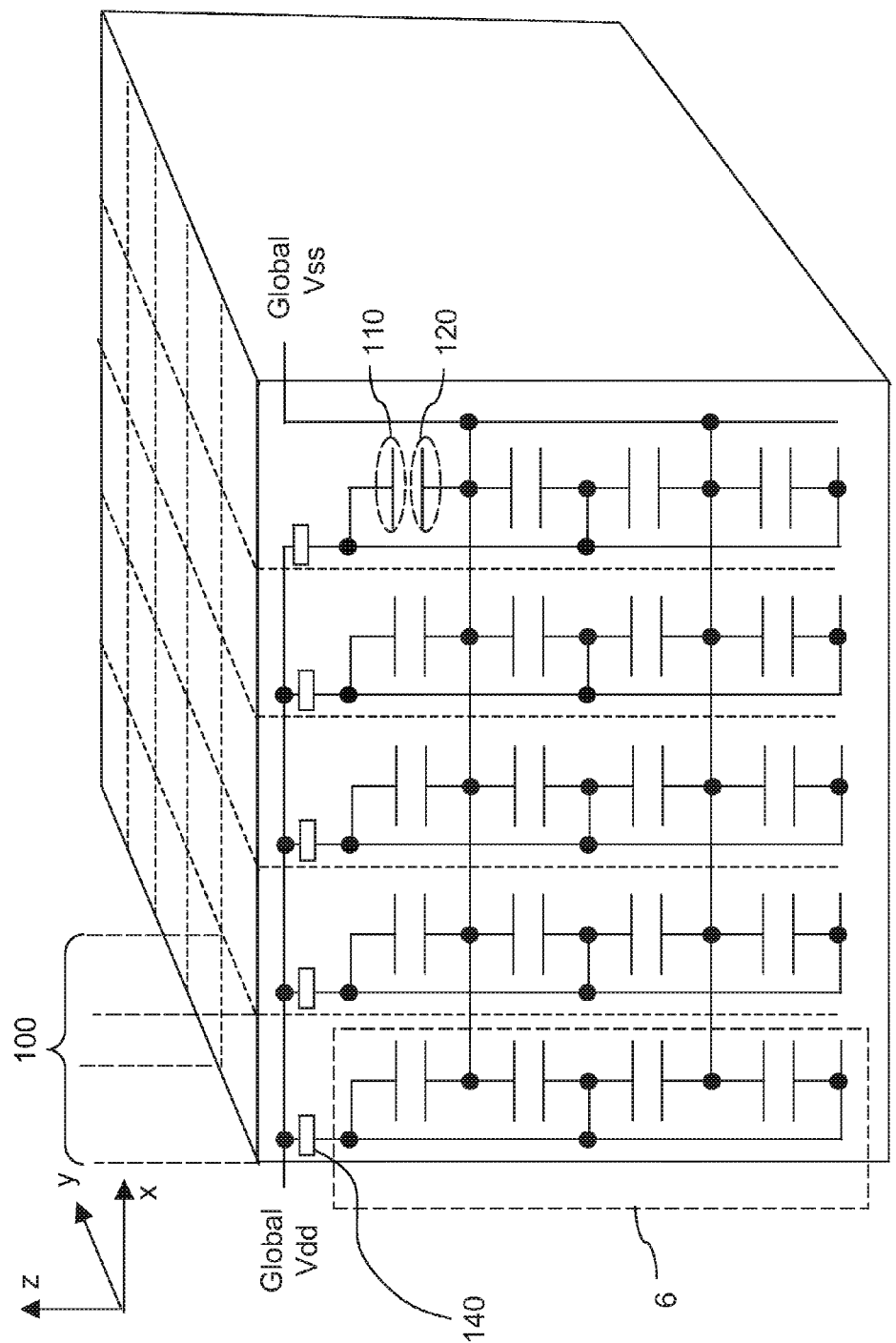
FIG. 1 is a schematic diagram of a first exemplary structure including a first array of vertically stacked capacitor modules according to a first embodiment of the present invention.

As stated above, the present invention relates to semiconductor devices and circuits, and particularly to a high-density, 3-dimensional microelectronic capacitor array, methods of manufacturing the same, and methods of operating the same, which are now described in detail with accompanying figures. Throughout the drawings, the same reference numerals or letters are used to designate like or equivalent elements. The drawings are not necessarily drawn to scale.

As used herein, "vertically stacked" elements mean elements in which each element among said elements overlies or underlies all other(s) of said elements.

Referring to FIG. 1, a schematic diagram of a first exemplary structure illustrates a first array of vertically stacked capacitor modules 100 according to a first embodiment of the present invention. Each vertically stacked capacitor module 100 includes a capacitor assembly 6 that is electrically connected to a first power supply node through a switching device 140. The first power supply node is labeled "Global Vdd." The capacitor assembly 6 includes a plurality of capacitors that are stacked in a vertical direction, i.e., in a direction perpendicular to a substrate on which the array of vertically stacked capacitor modules 100 is formed. The first array of vertically stacked capacitor modules 100 is repeated at least in one direction. For example, the first array of vertically stacked capacitor modules 100 can be repeated along the x-direction, along the y-direction, or in the two-dimensional plane including the x-axis and the y-axis.

Within each vertically stacked capacitor module 100, a switching device 140 and a capacitor assembly 6 are vertically stacked, i.e., overlie or underlie one another. Typically, the switching device 140 includes semiconductor devices located on a top surface of a semiconductor substrate, and the capacitor assembly 6 overlies the switching device 140 in each vertically stacked capacitor module 100. The lateral extent of each vertically stacked capacitor module 100 is limited along the horizontal directions, i.e., along the x-direction and the y-direction.

Each vertically stacked capacitor module 100 is electrically connected between the first power supply node and a second power supply node, which is labeled "Global Vss," in a parallel connection. The electrical connection to the first power supply node can be disabled in each of the vertically stacked capacitor modules 100 by the switching device 140 in the vertically stacked capacitor modules 100. The switching device 140 can be configured to automatically disconnect the plurality of capacitors 6 within the same vertically stacked capacitor module 100 when a leakage current within the plurality of capacitors 6 in the vertically stacked capacitor module 100 triggers turning-off of a circuit element in the switching device 140. Each of the capacitors in a capacitor assembly 6 includes a first electrode 110, a second electrode 120, and a node dielectric located therebetween.

By utilizing the capability to electrically disconnect vertically stacked capacitor modules 100 that have leakage currents high enough to trigger turning-off of a circuit element in a switching device 140, the level of the leakage current within an electrically connected portion, i.e., an actively functioning portion, of the array of vertically stacked capacitor modules 100 can be limited below a predetermined level. The array of vertically stacked capacitor modules 100 can be manufactured as a decoupling capacitor embedded a semiconductor chip. The electrical disconnection of vertically stacked capacitor modules 100 having high leakage currents can be effected during testing after manufacture and before usage, or alternately, during operation of a semiconductor chip in a computational system.

The capacitor assembly 6 can be implemented by employing at least three conductive plates that vertically overlie or underlie one another. Each of the at least three conductive plates are separated from one another by at least one node dielectric. The switching device 140 in a vertically stacked capacitor module 100 is configured to electrically disconnect the at least two capacitors from the first power supply node. The switching device 140 is connected to the first power supply node on one end and one of the at least three conductive plates on another end. The switching device 140 can include a field effect transistor and a sensor unit configured to detect a leakage current through the capacitor assembly 6 within the vertically stacked capacitor module 100.

The array of vertically stacked capacitor modules 100 can be an n×p array of vertically stacked capacitor modules 100. While FIG. 1 illustrates an array of vertically stacked capacitor modules in a 5×5 array, each of n and p can be any integer from 1 to 10,000,000, provided that at least one of n and p is greater than 1 to form an "array." The array of vertically stacked capacitor modules 100 includes a plurality of conductive layers, which are patterned to form conductive plates in each of the capacitor assemblies 6. Each conductive plate within a vertically stacked capacitor module 100 is electrically isolated from other conductive plates in other vertically stacked capacitor modules 100 in order to ensure that a switching device 140 can electrically disconnect a vertically stacked capacitor module 100.

The first power supply node, which is physically implemented as a power plane, is connected to the switching devices 140, but is not directly connected to the capacitor assemblies 6. The placement of the switching devices 140 between the first power supply node and the capacitor assemblies 6 minimizes parasitic electrical components when a defective capacitor assembly 6 is switched off from the power supply system, i.e., electrically disconnected from the first power supply node by a switching device 140. The first power supply node can be a node that supplies a non-zero voltage potential, and the second power supply node can be electrical ground. Alternately, both the first and second power supply nodes can supply non-zero voltage potentials, provided that the non-zero voltage potential from the first power supply node and the non-zero voltage potential from the second power supply node are different.

Figure 2:
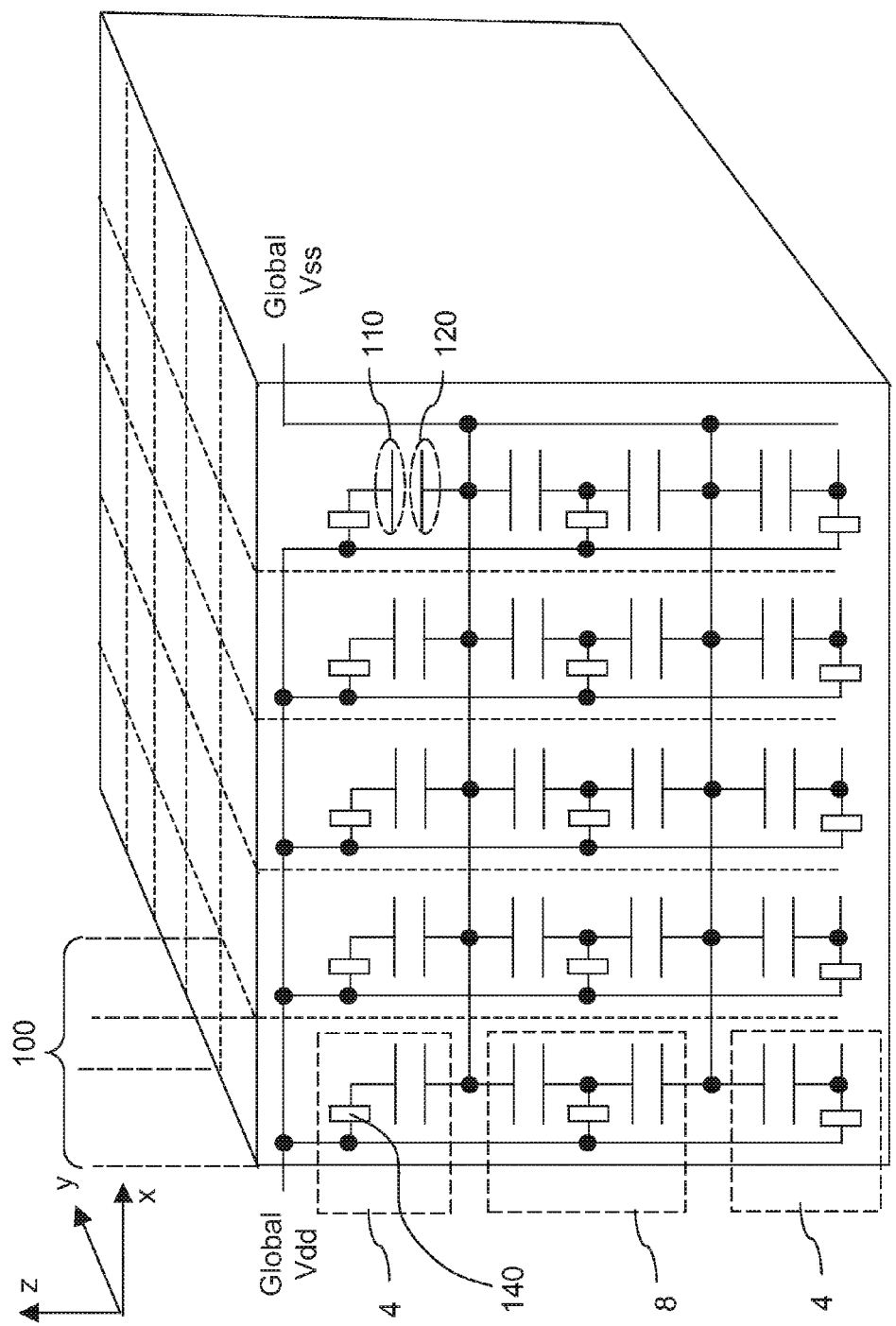
FIG. 2 is a schematic diagram of a second exemplary structure including a second array of vertically stacked capacitor modules according to a second embodiment of the present invention.

Referring to FIG. 2, a schematic diagram of a second exemplary structure illustrates a second array of vertically stacked capacitor modules 100 according to a second embodiment of the present invention. The second exemplary structure can be derived from the first exemplary structure by modifying the contents in each of the vertically stacked capacitor modules 100 in the first exemplary structure. Specifically, each vertically stacked capacitor module 100 in the second exemplary structure includes at least one first-type capacitor module 4 and at least one second-type capacitor module 8. Each of the at least one first-type capacitor module 4 includes a switching device 140 and a capacitor. Each of the at least one second-type capacitor module 8 includes a switching device 140 and a plurality of capacitors. The difference between the first-type capacitor module 4 and the second-type capacitor module 8 is the number of capacitors included therein, i.e., whether a single capacitor is present or a plurality of capacitors is present.

Each of the at least one first-type capacitor module 4 and the at least one second-type capacitor module 8 is electrically connected to a first power supply node, which is labeled "Global Vdd," through a switching device 140. The second-type capacitor module 8 includes a plurality of capacitors that are stacked in a vertical direction as in the first embodiment. The first array of vertically stacked capacitor modules 100 is repeated at least in one direction as in the first embodiment.

Each vertically stacked capacitor module 100 is electrically connected between the first power supply node and a second power supply node, which is labeled "Global Vss," in a parallel connection as in the first embodiment. The switching device 140 is configured to automatically disconnect a capacitor or capacitors in a first-type capacitor module 4 or a second-type capacitor module when a leakage current within the first-type capacitor module 4 or the second-type capacitor module 8 in the vertically stacked capacitor module 100 triggers turning-off of a circuit element in a switching device 140 therein. Each of the capacitors in first-type capacitor modules 4 and second-type capacitor modules 8 includes a first electrode 110, a second electrode 120, and a node dielectric located therebetween. The second exemplary structure can provide the same functionality as the first exemplary structure at an enhanced granularity, i.e., the number of capacitors controlled by each switching device 140 is less than a corresponding number in the first exemplary structure.

The at least one first-type capacitor module 4 and the at least one second-type capacitor module 8 in each vertically stacked capacitor module 100 can be implemented by employing at least three conductive plates that vertically overlie or underlie one another. Each of the at least three conductive plates are separated from one another by at least one node dielectric. Each switching device 140 is configured to electrically disconnect at least one capacitors from the first power supply node. Each switching device 140 is connected to the first power supply node on one end and one of the at least three conductive plates on another end. Each switching device 140 can include a field effect transistor and a sensor unit configured to detect a leakage current through a first-type capacitor module 4 or a second-type capacitor module 8 within the vertically stacked capacitor module 100.

The array of vertically stacked capacitor modules 100 can be an n×p array of vertically stacked capacitor modules 100 as in the first embodiment. The first power supply node, which is physically implemented as a power plane, is connected to the switching devices 140, but is not directly connected to the first-type capacitor modules 4 or the second-type capacitor modules 8. The placement of the switching devices 140 between the first power supply node and one of the first-type capacitor modules 4 or the second-type capacitor modules 8 minimizes parasitic electrical components when a defective first-type capacitor modules 4 or a defective second-type capacitor modules 8 is switched off from the power supply system. The first power supply node can be a node that supplies a non-zero voltage potential, and the second power supply node can be electrical ground or a node that supplies a non-zero voltage potential as in the first embodiment.

Figure 3:
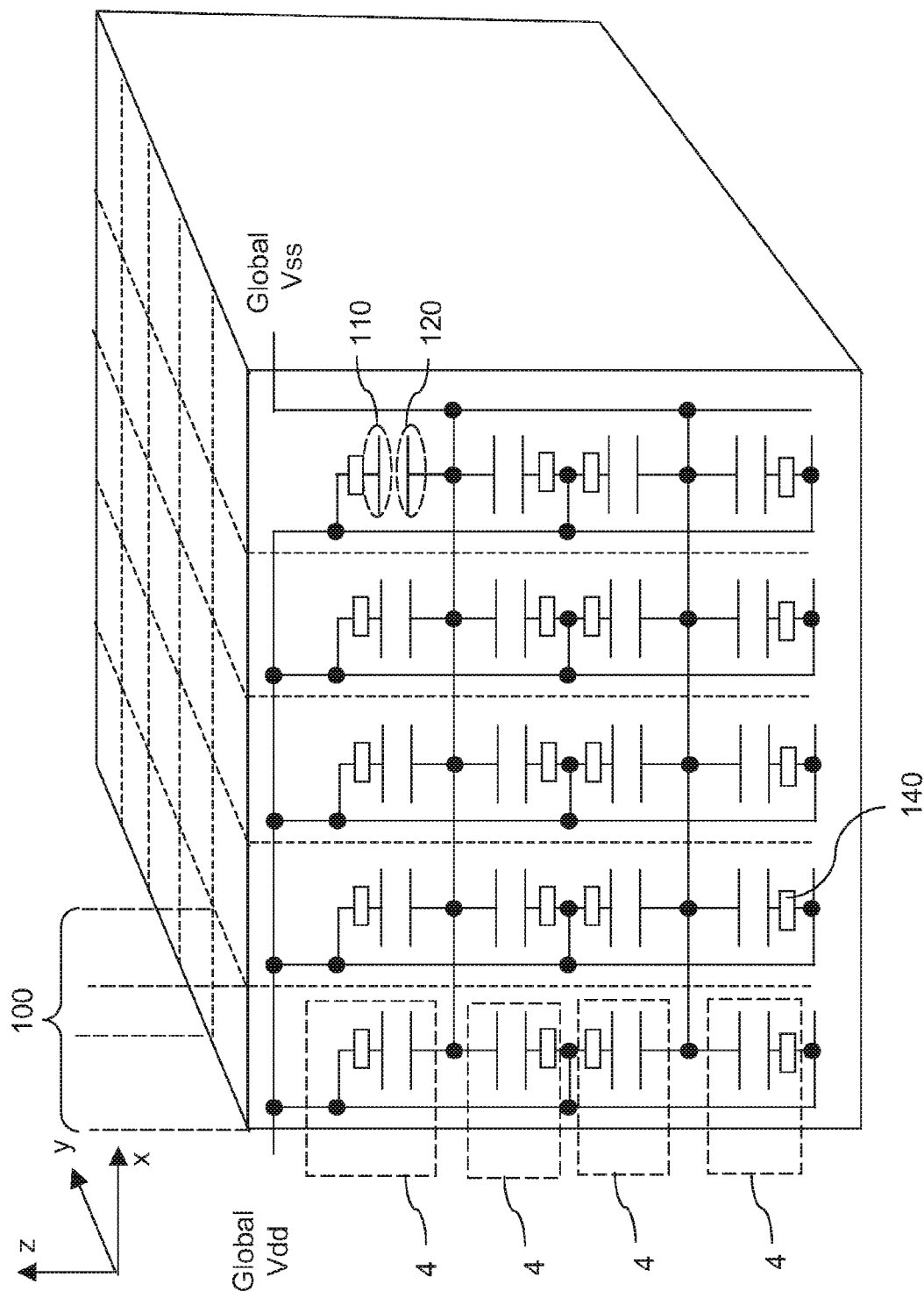
FIG. 3 is a schematic diagram of a third exemplary structure including a third array of vertically stacked capacitor modules according to a third embodiment of the present invention.

Referring to FIG. 3, a schematic diagram of a third exemplary structure illustrates a third array of vertically stacked capacitor modules 100 according to a third embodiment of the present invention. The third exemplary structure can be derived from the first or second exemplary structure by modifying the contents in each of the vertically stacked capacitor modules 100 in the first or second exemplary structure. Specifically, each vertically stacked capacitor module 100 in the third exemplary structure includes a plurality of first-type capacitor modules 4. Each of the plurality of first-type capacitor modules 4 includes a switching device a capacitor. Thus, each capacitor in the vertically stacked capacitor module 100 can be disconnected from a first power supply node by a switching device 140.

The third exemplary structure provides the same functionality as the first and second exemplary structures with an enhanced granularity because each capacitor can be individually disconnected from the power supply system. The third exemplary structure can be manufactured and operated employing the methods described in the first and second embodiments.

Figure 4:
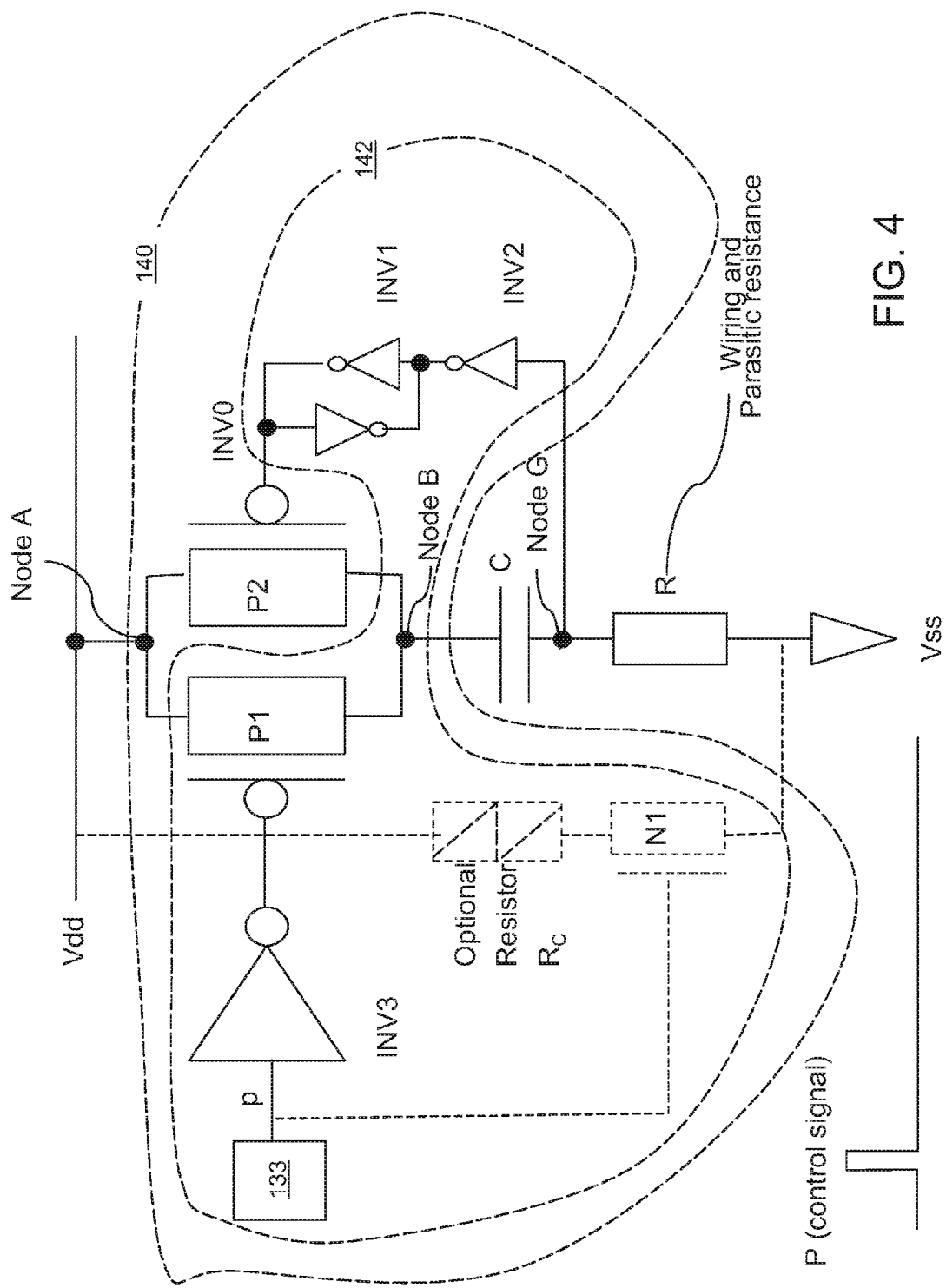
FIG. 4 is a schematic of an exemplary circuit according to a fourth embodiment of the present invention.

Referring to FIG. 4, a schematic of an exemplary circuit that can be employed for a switching device 140 in a vertically stacked capacitor module 100 is shown according to a fourth embodiment of the present invention.

The switching device 140 includes a field effect transistor labeled P2 and a sensor unit 142 that is configured to detect a leakage current through a capacitor C. A first-type capacitor module can include the switching device 140 and the capacitor. A second-type capacitor module can include the switching device 140 and the capacitor C and additional capacitors in a parallel connection with the capacitor C. A vertically stacked capacitor module 100 of the first embodiment can include the switching device 140 and a plurality of a parallel connection of capacitors that replace the capacitor C.

The sensor unit 142 includes a transistor labeled "P1." The transistor labeled "P1" can be a first p-type field effect transistor, and the field effect transistor labeled "P2" can be a second p-type field effect transistor. The first and second p-type field effect transistors are connected in a parallel connection between a first power supply node, which is herein referred to as "node A," and a first node of the capacitor C, which is herein referred to as "node B." The sensor unit 142 is configured to provide a voltage to a gate of the transistor labeled "P2." The voltage provided to the gate of the transistor labeled P2 is determined by the amount of the leakage current through the capacitor C.

A drain of the second p-type field effect transistor is connected directly to the power supply node, and a source of the second p-type field effect transistor is connected directly to the node of the capacitor. The second p-type field effect transistor has a lower transconductance, and correspondingly, a greater current capacity, that the first p-type field effect transistor. The sensor unit 142 includes an even number of inverters in a series connection located between a second node of the capacitor C, which is herein referred to as "node G," and a gate of the second p-type field effect transistor. For example, the even number of inverters in a series connection can be a series connection of a first inverter labeled "INV1" and a second inverter labeled "INV2." Further, one or more of the inverters can be combined with at least another inverter, such as an inverter labeled "INV0," to form a latch.

The sensor unit 142 can include a pulse generator 133 that is configured to provide a signal pulse of a finite duration to a gate of the first p-type field effect transistor. The duration of the pulse can be from 1 picosecond to 10 seconds, and typically from 1 nanosecond to 1 millisecond, although lesser and greater durations can also be employed. The signal pulse turns on the first p-type field effect transistor during the duration of the signal pulse and applies to node B a voltage potential that is substantially the same as the voltage potential at node A, i.e., at the first power supply node.

Optionally, the sensor unit 142 can include a resistor RC physically located adjacent to the capacitor C and configured to raise a temperature of the capacitor C during the duration of the signal pulse. This functionality can be effected by connecting the resistor RC to an optional transistor labeled "N1," which can be an n-type field effect transistor, in a series connection between the first power supply node, i.e., node A, and a second power supply node that is labeled Vss. The leakage current increases with the elevating of the temperature at the capacitor C due to the heating provided by the resistor RC. Vss can be electrical ground, or can be at a non-zero voltage potential that is different from the voltage potential at the first power supply node. The gate of the transistor "N1" is connected to the pulse generator 133. The transistor "N1" turns on during the duration of the signal pulse.

The resistor $R_C$ is a heater that is located adjacent to the capacitor C (or capacitors connected to the switching device 140) so that leakage rate of the capacitor C is enhanced and the switching-off the capacitor C can be accelerated before an adverse effect to the power supply system is manifested in a significant manner. The first and second p-type field effect transistors (corresponding to "P1" and "P2") are employed in order to enable a temporary disconnection and a permanent disconnection, respectively, between the capacitor C and the first power supply node.

The first p-type field effect transistor "P1" is used for sensing the leakage current through the capacitor C. During the duration of a signal pulse "p," the first p-type field effect transistor "P1" is turned on via an inverter labeled "INV3." During the duration of the signal pulse, the capacitor C is connected to the first power supply node labeled "Vdd" via the first p-type field effect transistor "P1."

If the capacitor C is not leaky, then voltage potential at node G is substantially the same as the voltage provided by the second power supply node Vss. A feedback control signal is formed via the two inverters INV1 and INV2, thereby turning on the second p-type field effect transistor "P2" that has a greater current capacity than the first p-type field effect transistor "P1." Even after the pulse is turned off, the second p-type field effect transistor "P2" is remains firmly turned on.

If the capacitor C is leaky, then the voltage potential at node G drifts away from the voltage potential supplied by the second power supply node "Vss" toward the voltage potential provided by the first power supply node "Vdd." This is because the capacitor C behaves like a resistor that is stacked with a parasitic wiring resistor "R" in a series connection between node B and the second power supply node "Vss." Thus, an anomaly is generated at node G in the form of a deviation from the voltage potential at the second power supply node "Vss." This anomaly at node G trigger switching of the state in the inverter labeled "INV2," thereby turning off the second p-type field effect transistor "P2." Since the inverter labeled "INV0" and the inverter labeled "INV1" form a latch, the output from the inverter labeled "INV1" is held high, and the second p-type field effect transistor "P2" is turned off, electrically disconnecting the capacitor C from the first power supply node "Vdd." After the duration of the signal pulse "p," the first p-type field effect transistor "P1" is also turned off. The capacitor C is completely disconnected from the first power supply node "Vdd" electrically at this point.

A circuit of the fourth embodiment of the present invention can be embodied in a semiconductor structure according to any of the first, second, and third embodiments. The semiconductor structure includes an array of capacitor modules, in which each of the capacitor modules includes a capacitor and a switching device 140 connected to a first power supply node "Vdd." A first component of a switching device 140, such as the first p-type field effect transistor "P1," can be turned off within a capacitor module among the array of capacitor modules. A leakage current through a capacitor C within the capacitor module triggers turning off of a second component, such as the second p-type field effect transistor "P2," within the capacitor module. The capacitor C within the capacitor module can be electrically isolated from the first power supply node "Vdd" as the second component is turned off due to the leakage current in the capacitor C.

Referring to FIGS. 5A-5K, sequential vertical cross-sectional views of a fourth exemplary structure are shown during processing steps according to a fifth embodiment of the present invention. The fourth exemplary structure includes a capacitor assembly that can be incorporated as a capacitor assembly 6 in the first exemplary structure of FIG. 1. In case the fourth exemplary structure is incorporated into the first exemplar structure, the switching devices 140 in FIG. 1 are manufactured on a top surface of a semiconductor substrate (not shown) prior to formation of the fourth exemplary structure. After forming a dielectric layer (not shown) over the semiconductor devices that function as the switching devices 140 to provide electrical isolation, the capacitor assemblies are subsequently formed over the switching devices.

Referring to FIG. 5A, a vertically stacked capacitor module 100 is formed within an area between two dotted vertical lines. The vertically stacked capacitor module 100 can be repeated in one direction as a one-dimensional array or in two directions as a two-dimensional array. The two dotted vertical lines represent boundaries between the vertically stacked capacitor module 100 and other vertically stacked capacitor modules surrounding the vertically stacked capacitor module 100 illustrated herein.

The first conductive plate 10 is formed in a first metallization step, for example, by patterning a first conductive layer. The first conductive plate 10 is a metal such as Cu, W, Ta, Ti, WN, TaN, TiN, Au, Ag, Sn, or a combination thereof. The lateral extent of the first conductive plate 10 is limited within the periphery of the vertically stacked capacitor module 100 so that the first conductive plate 10 in the vertically stacked capacitor module 100 is electrically isolated from other first conductive plates (not shown) in neighboring vertically stacked capacitor modules (not shown).

A first etch stop layer 12 can be formed to facilitate formation of contacts that subsequently land on the first conductive plate 10. The first etch stop layer 12 can be a dielectric material such as silicon nitride, silicon oxide, silicon oxynitride, BLoK™, NBLoK™, or any other dielectric material that can be employed to retard an etching process for conductive materials. For example, the material for the first etch stop layer 12 can be a CVD nitride, $Al_2O_3$, or any other material that is resistant to a $Cl_2$ plasma, which is commonly employed in anisotropic etching processes.

A first node dielectric 15 is deposited, and a second conductive layer 20L is deposited on the first node dielectric 15. The first node dielectric 15 is a dielectric material such as silicon nitride or a high dielectric constant (high-k) dielectric material. The high-k dielectric material can be a dielectric metal oxide material having a dielectric constant greater than 8.0. The high-k dielectric material typically includes a metal and oxygen, and optionally nitrogen and/or silicon. Exemplary high-k dielectric materials include $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, a silicate thereof, and an alloy thereof. The value of x and y can independently be from 1 to 3. A high-k dielectric material can be formed by methods well known in the art including, for example, chemical vapor deposition (CVD), atomic layer deposition (ALD), molecular beam deposition (MBD), pulsed laser deposition (PLD), liquid source misted chemical deposition (LSMCD), etc. The thickness of the first node dielectric can be from 1 nm to 500 nm, and typically from 50 nm to 200 nm, although lesser and greater thicknesses can also be employed.

A second conductive layer 20L is formed on the first node dielectric 15. The second conductive layer 20L can be any material that may be employed for the first conductive plate 10. A second etch stop layer 22 can be formed to facilitate formation of contacts that subsequently land on remaining portions of the second conductive layer 20L. The second etch stop layer 22 can be any material that may be employed for the first etch stop layer 12. A first photoresist 27 is applied over the second conductive layer 20L and lithographically patterned to form a first opening in an area overlying a portion of the first etch stop layer 12.

Referring to FIG. 5B, the second conductive layer 20L is patterned to form a second conductive plate 20 employing the first photoresist 27 as an etch mask. The second conductive plate 20 can be a single contiguous piece including a hole in an area corresponding to the area of the opening in the first photoresist 27. The material of the second conductive layer 20L is removed along the periphery of the vertically stacked capacitor module 100 so that the second conductive plate 20 in the vertically stacked capacitor module 100 is electrically isolated from other second conductive plates (not shown) in neighboring vertically stacked capacitor modules (not shown). The first photoresist 27 is subsequently removed, for example, by ashing.

Referring to FIG. 5C, a second node dielectric 25 is formed on the second conductive plate 20. The second node dielectric 25 can be any material that may be employed for the first node dielectric 15. The second node dielectric 25 can be formed employing the same methods as the first node dielectric 15. The thickness of the second node dielectric 25 can be in the range of the thickness of the first node dielectric 15.

Referring to FIG. 5D, a third conductive layer 30L is formed on the second node dielectric 25. The third conductive layer 30L can be any material that may be employed for the first conductive plate 10.

Referring to FIG. 5E, a second photoresist 37 is applied over the third conductive layer 30L and lithographically patterned to form a second opening in an area overlying a portion of the second etch stop layer 22. The third conductive layer 30L is patterned to form a third conductive plate 30 employing the second photoresist 37 as an etch mask. The third conductive plate 30 can be a single contiguous piece including a hole in an area corresponding to the area of the opening in the second photoresist 37. The material of the third conductive layer 30L is removed along the periphery of the vertically stacked capacitor module 100 so that the third conductive plate 30 in the vertically stacked capacitor module 100 is electrically isolated from other third conductive plates (not shown) in neighboring vertically stacked capacitor modules (not shown). The second photoresist 37 is subsequently removed, for example, by ashing.

Referring to FIG. 5F, a third node dielectric 35 is formed on the third conductive plate 30. The third node dielectric 35 can be any material that may be employed for the first node dielectric 15. The third node dielectric 35 can be formed employing the same methods as the first node dielectric 15. The thickness of the third node dielectric 35 can be in the range of the thickness of the first node dielectric 15.

Figure 5G:
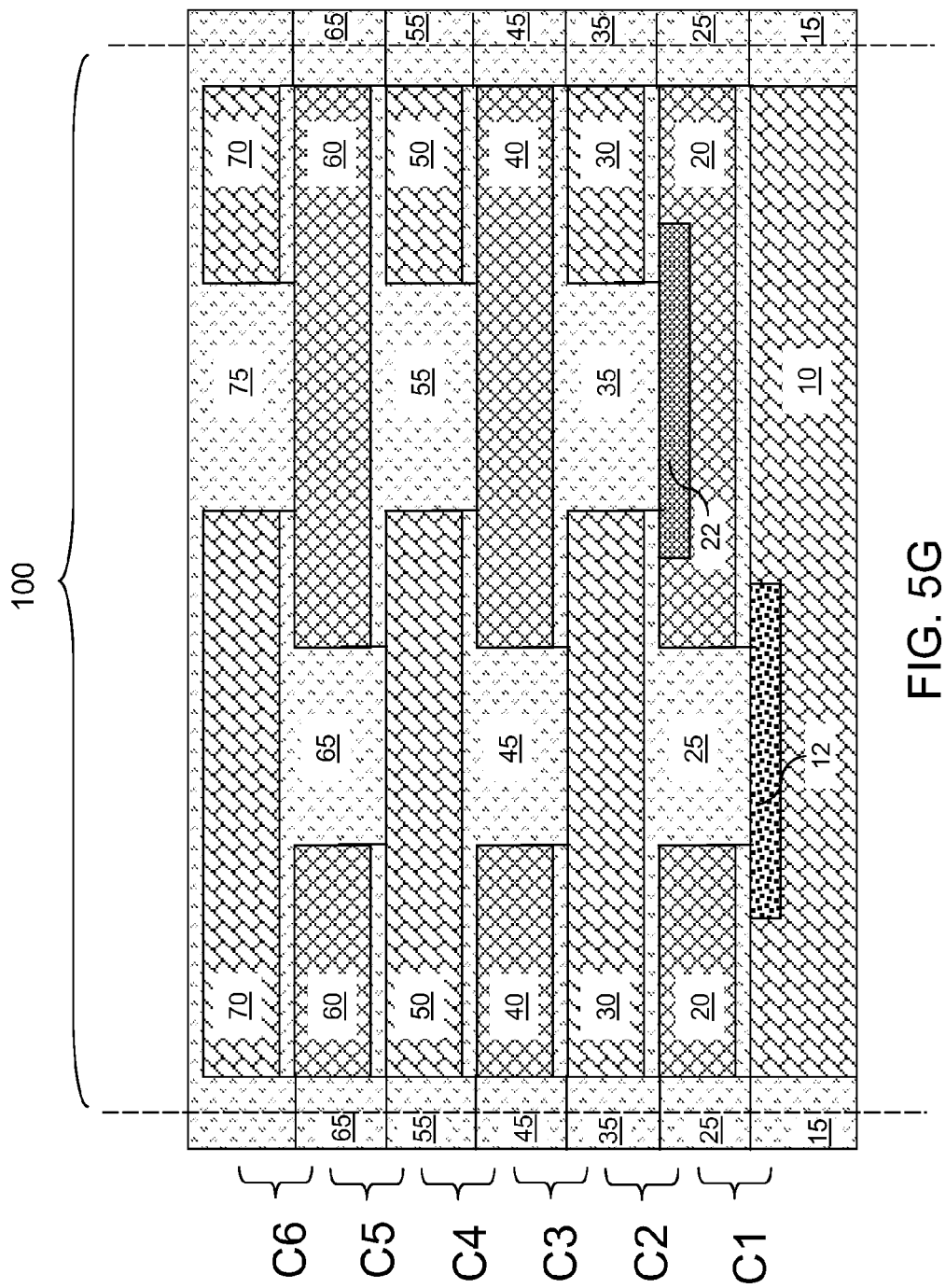

Referring to FIG. 5G, the methods employed to form the second and third conductive plates (20, 30) and the second and third node dielectrics (25, 35) can be repeated applied to sequentially form additional conductive plates and additional node dielectrics. For example, the additional conductive plates and the additional node dielectrics can include a fourth conductive plate 40, a fourth node dielectric 45, a fifth conductive plate 50, a fifth node dielectric 55, a sixth conductive plate 60, a sixth node dielectric 65, a seventh conductive plate 70, and a seventh node dielectric 75.

A pair of neighboring conductive plates around a node dielectric constitutes a capacitor. For example, the first conductive plate 10, the first node dielectric 15, and the second conductive plate 20 constitute a first capacitor C1. The second conductive plate 20, the second node dielectric 25, and the third conductive plate 30 constitute a second capacitor C2. The third conductive plate 30, the third node dielectric 35, and the fourth conductive plate 40 constitute a third capacitor C3. The fourth conductive plate 40, the fourth node dielectric 45, and the fifth conductive plate 50 constitute a fourth capacitor C4. The fifth conductive plate 50, the fifth node dielectric 55, and the sixth conductive plate 60 constitute a fifth capacitor C5. The sixth conductive plate 60, the sixth node dielectric 65, and the seventh conductive plate 70 constitute a sixth capacitor C6. Similar capacitors are formed in each of the neighboring vertically stacked capacitor modules (not shown).

In general, at least three conductive plates and at least one node dielectric constitute at least two capacitors in each vertically stacked capacitor module 100. One of the at least three conductive plates is a common node of the at least two capacitors. The at least three conductive plates vertically overlie or underlie one another. The at least three conductive plates are separated from one another by at least one node dielectric. Typically, each vertically stacked capacitor module 100 includes at least a first node dielectric 15 and a second node dielectric 25. The first node dielectric 15 contacts an upper surface of a first conductive plate 10 among the at least three conductive plates and a lower surface of a second conductive plate 20 among the at least three conductive plates. The second node dielectric 25 contacts an upper surface of the second conductive plate 20 among the at least three conductive plates and a lower surface of a third conductive plate 30 among the at least three conductive plates.

Figure 5H:
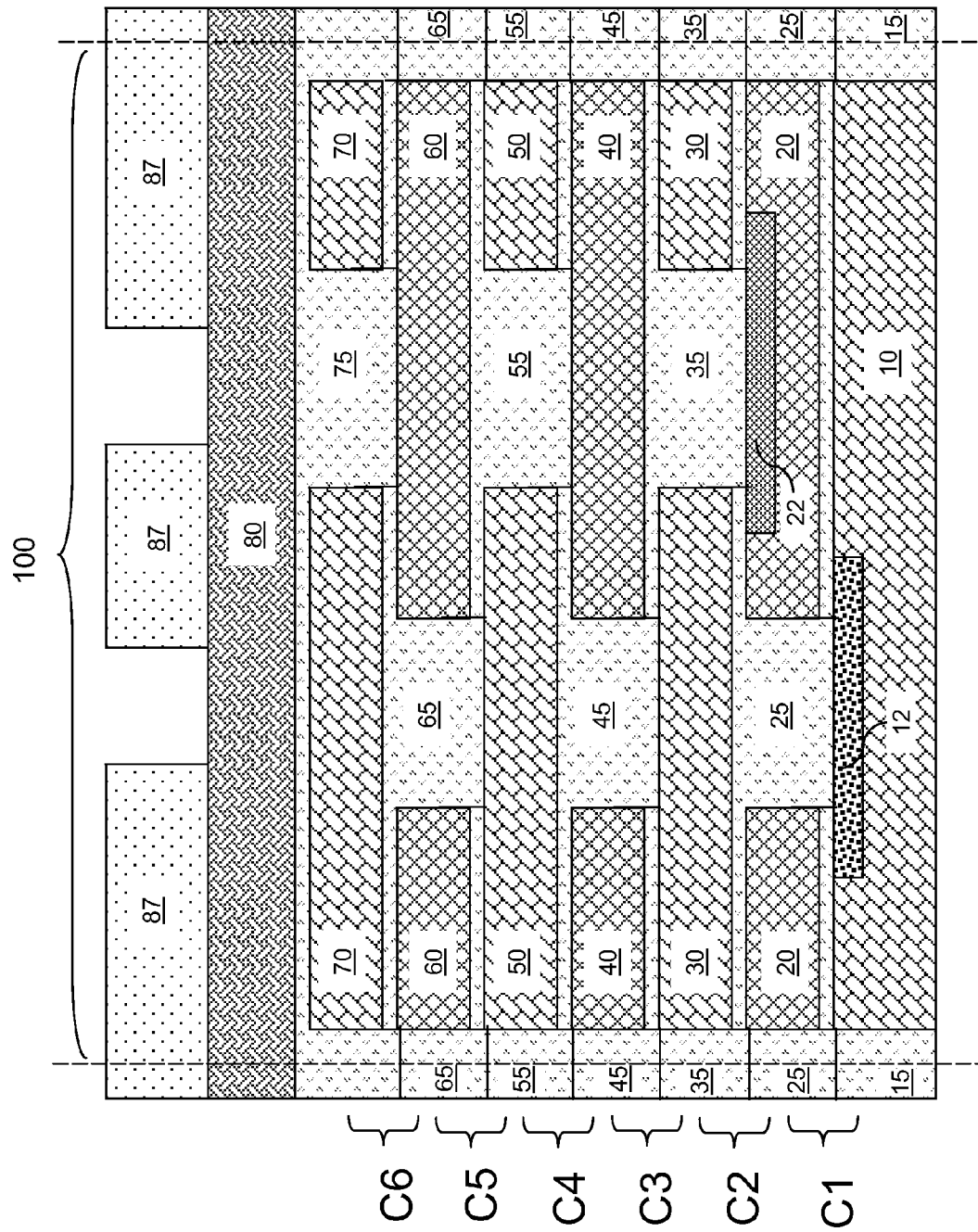

Referring to FIG. 5H, a passivation layer 80 can be formed on the stack of capacitors (C1-C6). The passivation layer 80 includes a dielectric material that provides passivation of the stack of capacitors (C1-C6). For example, the passivation layer 80 can be a layer of silicon nitride. The thickness of the passivation layer 80 can be from 3 nm to 500 nm, although lesser and greater thicknesses can also be employed. A third photoresist 87 is applied over the top surface of the passivation layer 80 and lithographically patterned to form two openings therein.

Figure 5I:
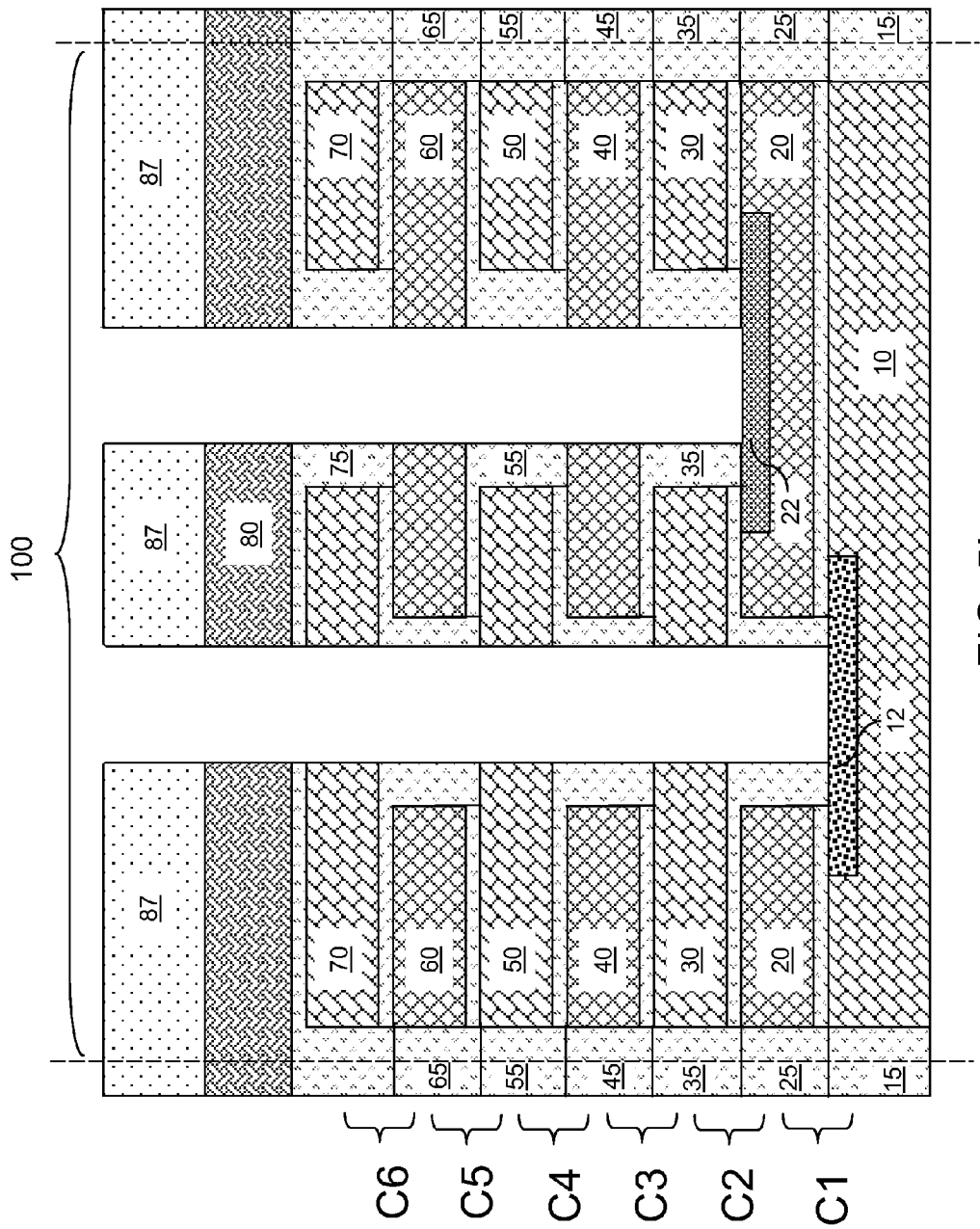

Referring to FIG. 5I, the pattern in the third photoresist 87 is transferred through the passivation layer 80, various conductive plates, and various node dielectrics down to an upper surface of the first etch stop layer 12 or the upper surface of the second etch stop layer 22. Stopping the etching process on the upper surfaces of the first and second etch stop layers (12, 22) can be effected by selecting an etch process, which is typically an anisotropic reactive ion etch, that is selective to the materials of the first and second etch stop layers (12, 22).

Figure 5J:
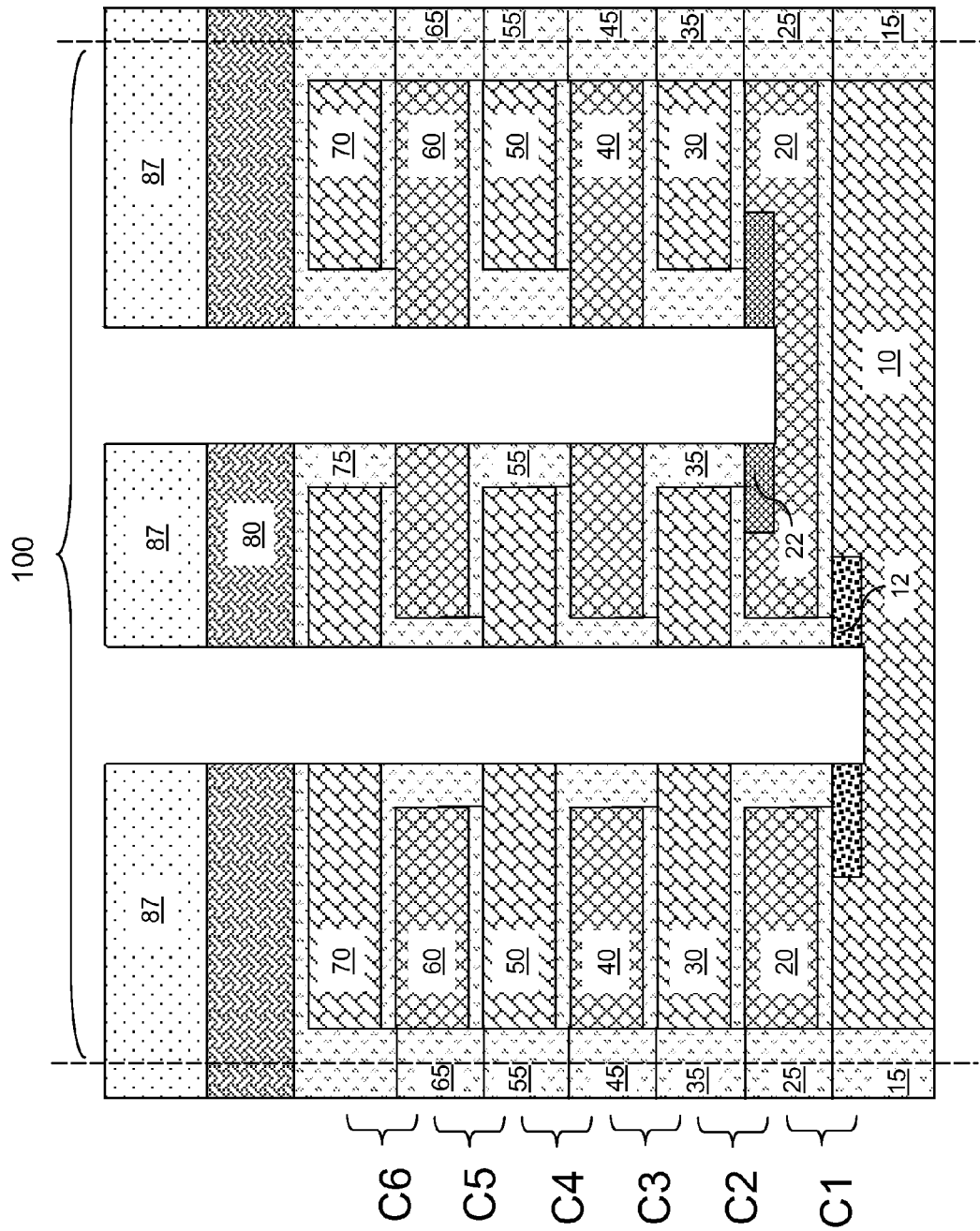

Referring to FIG. 5J, another etch is performed with a different etch chemistry to etch through the first and second etch stop layers (12, 22) and to expose upper surfaces of the first and second conductive plates (10, 20).

Figure 5K:
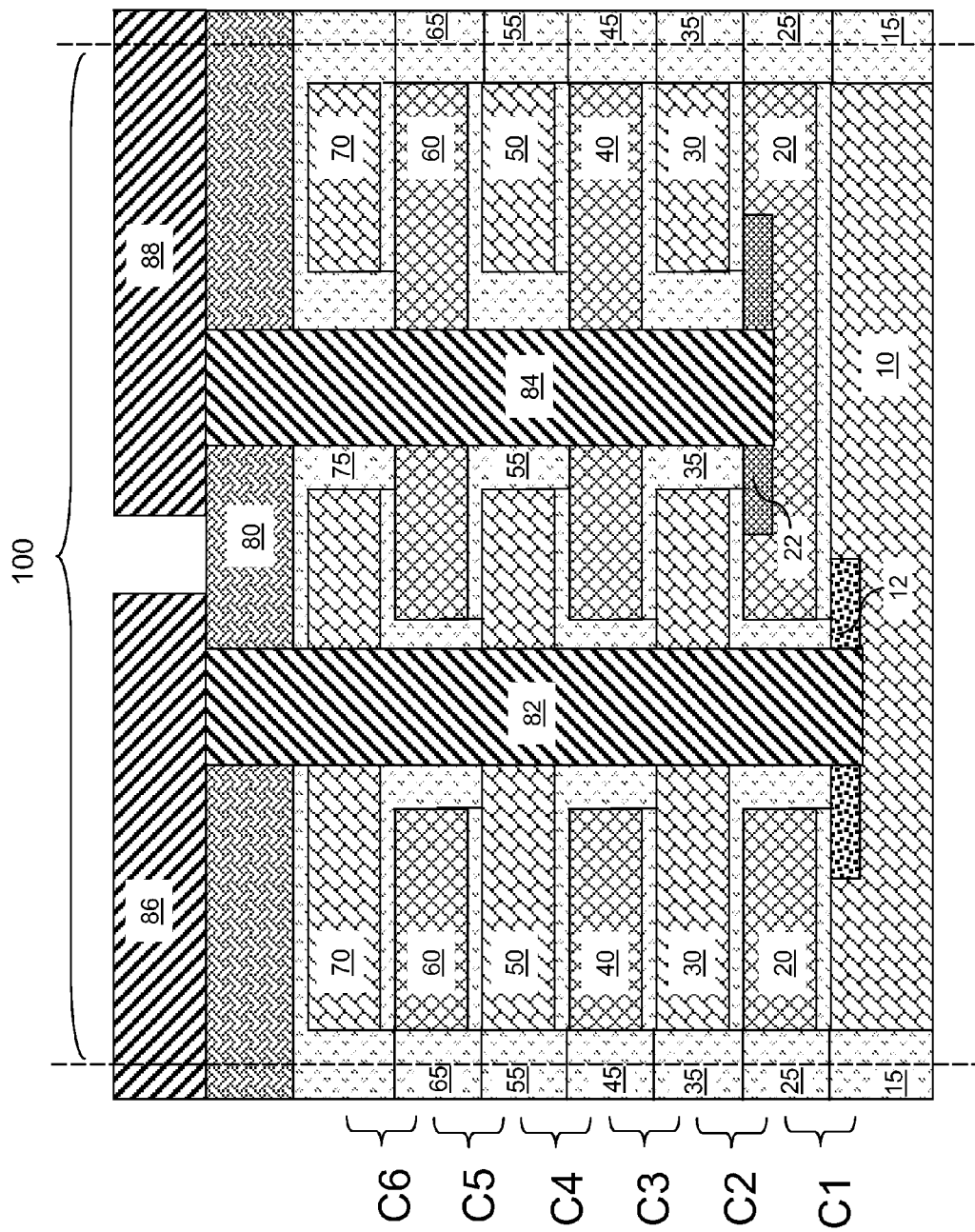

Referring to FIG. 5K, the two cavities in the vertically stacked capacitor module 100 are filled with a conductive material and subsequently planarized employing the passivation layer 80 as a stopping layer for chemical mechanical planarization (CMP) or a recess etch. The conductive material that fills the two cavities forms a first power-supply-side via structure 82 and a second power-supply-side via structure 84. Additional power-supply-side via structures are formed concurrently in the neighboring vertically stacked capacitor modules (not shown).

A first power-supply-side plate 86 and a second power-supply-side plate 88 can be formed by depositing a metallic material over the passivation layer 80 and patterning the metallic material. The first power-supply-side plate 86 can perform the function of a first power supply node labeled "Global Vdd" in FIG. 1, and the second power-supply-side plate 88 can perform the function of a second power supply node labeled "Global Vss" in FIG. 1.

The capacitance of the fifth exemplary structure per unit area can be greater than comparable capacitance enabled by prior art structures. For example, if the various node dielectrics employ a high-k dielectric material having a thickness of 100 nm, and if 10 capacitors are stacked vertically, the capacitance per unit area for the fifth exemplary structure can be about $0.26 \text{ nF}/\mu\text{m}^2$.

Figure 6A:
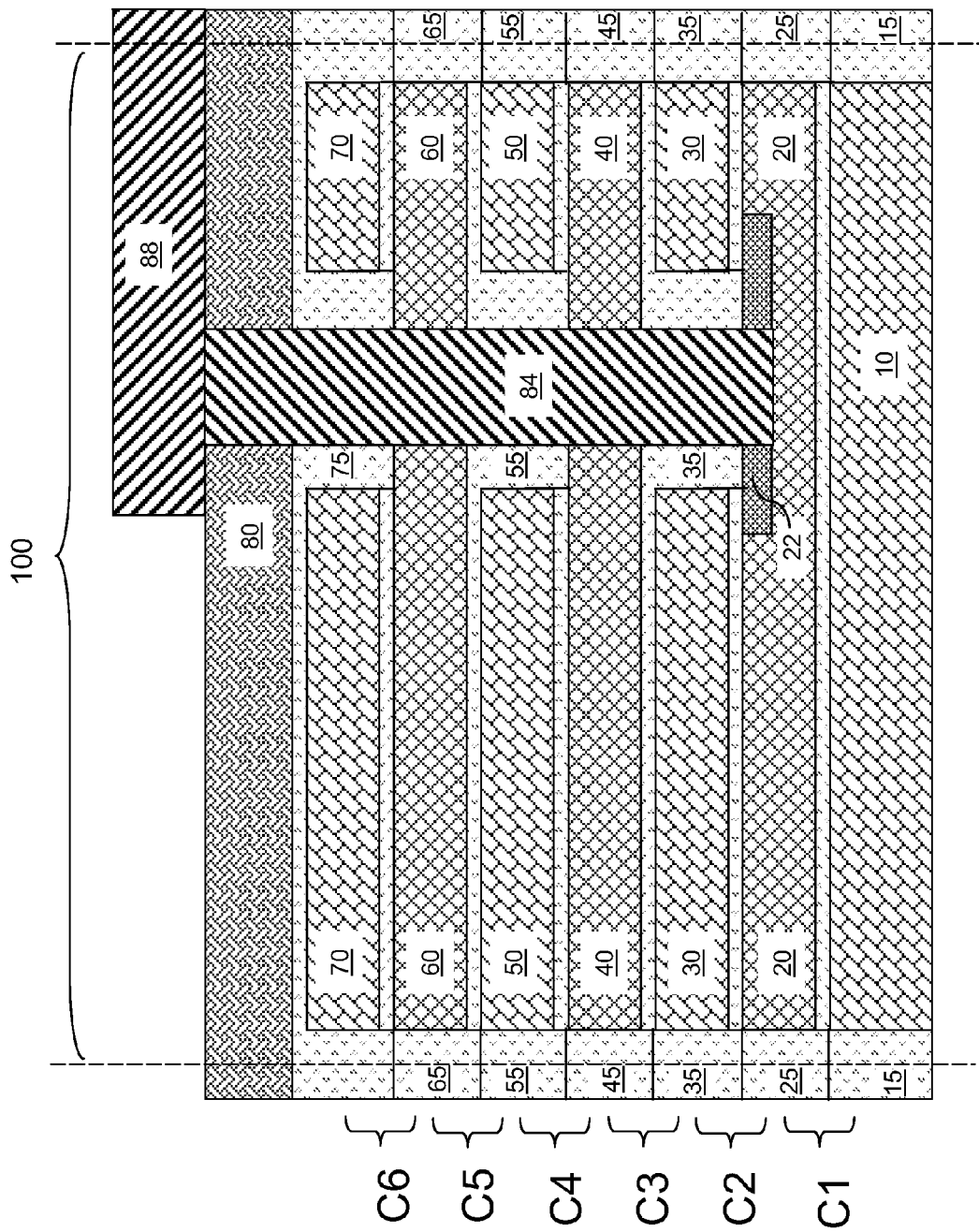
FIG. 6A is a vertical cross-sectional view of a fifth exemplary structure according to a sixth embodiment of the present invention.
Figure 6B:
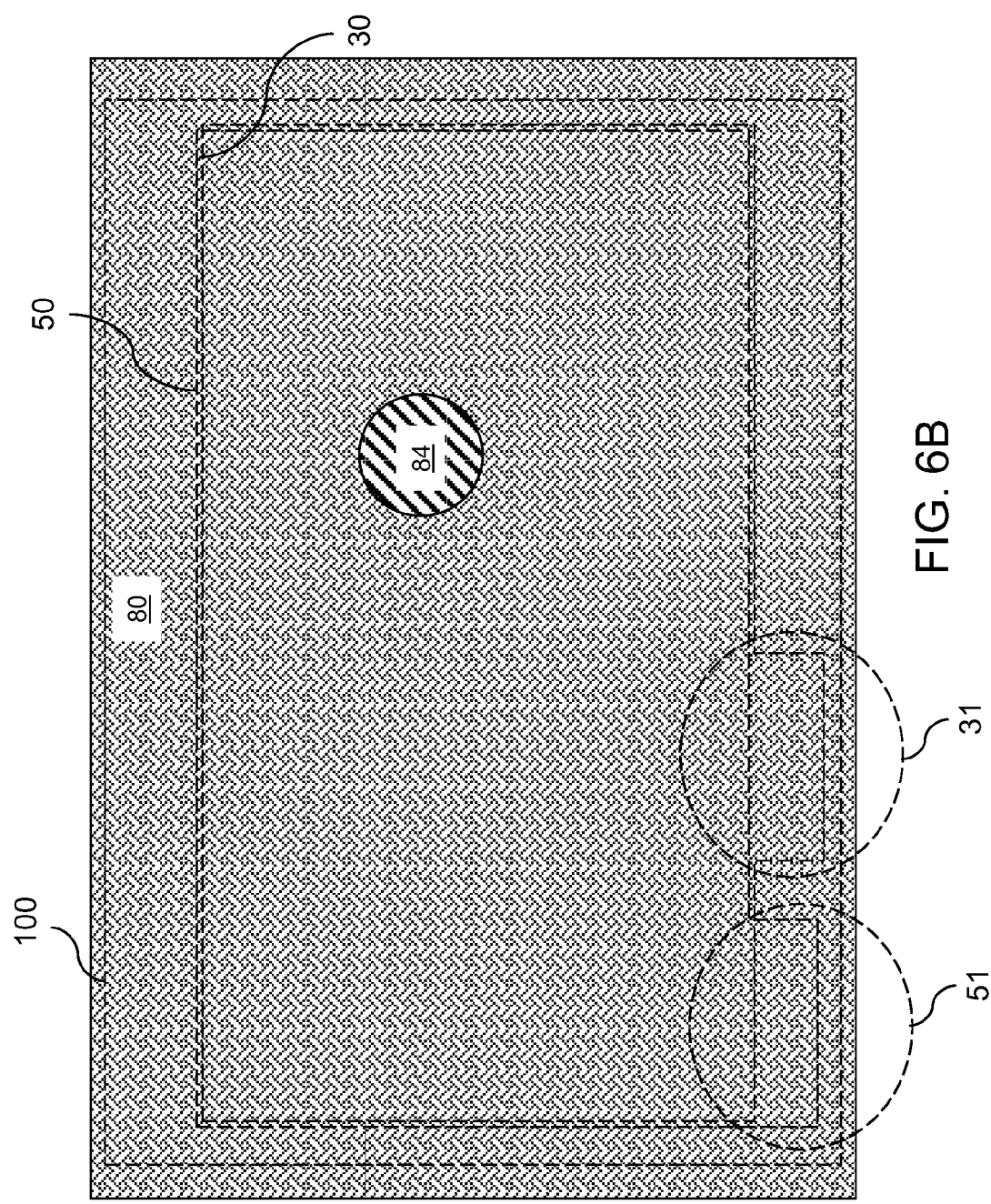
FIG. 6B is a top-down view of the fifth exemplary structure according to the sixth embodiment of the present invention. A second power-supply-side plate has been removed for clarity in FIG. 5B.
Figure 6C:
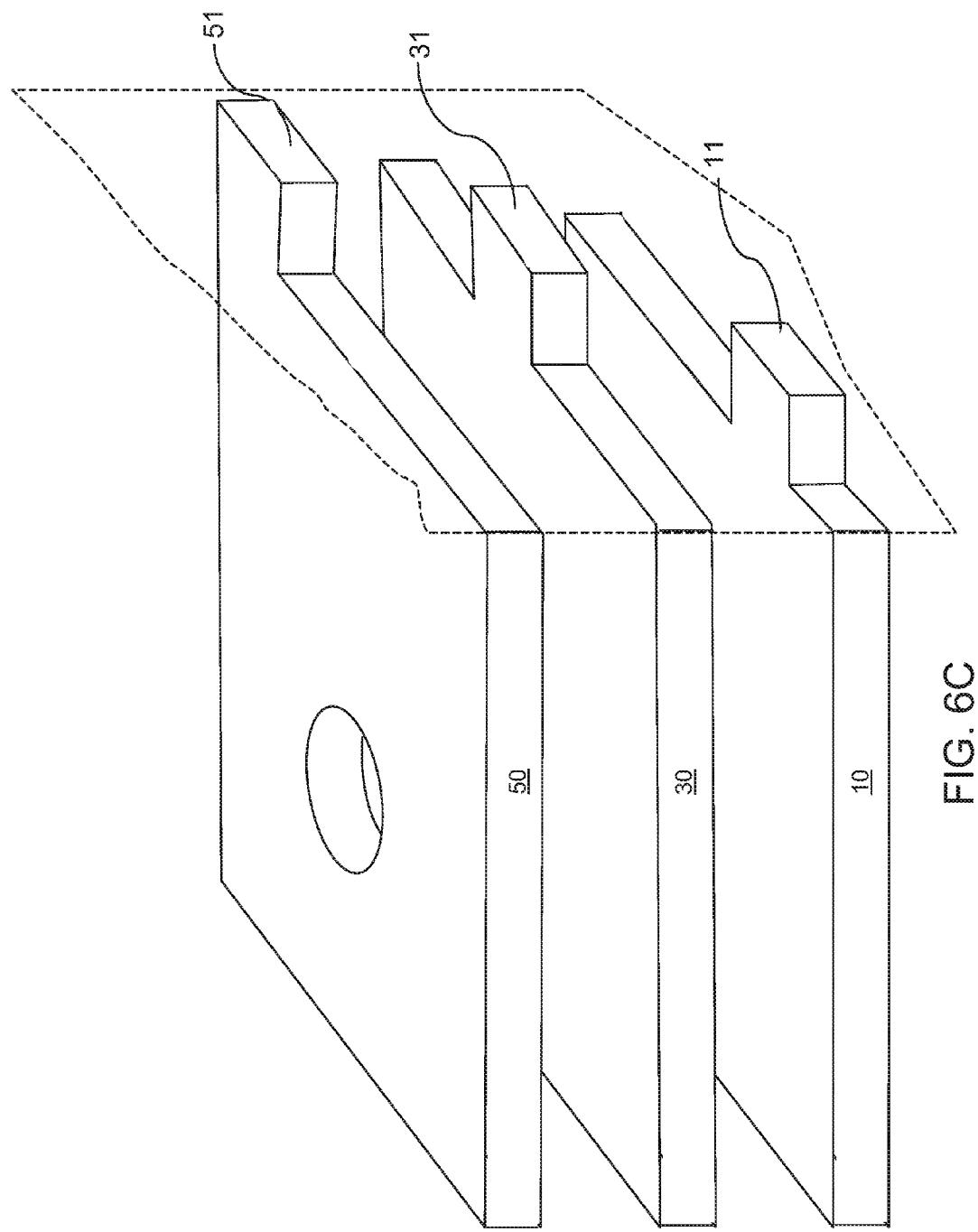
FIG. 6C is a bird's eye view of selected elements of the fifth exemplary structure according to the sixth embodiment of the present invention.

Referring to FIGS. 6A-6C, a fifth exemplary structure according to a sixth embodiment of the present invention is shown. FIG. 6A is a vertical cross-sectional view, FIG. 6B is a top-down view in which a second power-supply-side plate 88 has been removed for clarity, and FIG. 6C is a bird's eye view of a first conductive plate 10, a third conductive plate 30, and a fifth conductive plate 50.

The fifth exemplary structure can be derived from the fourth exemplary structure by not patterning any structure in an area corresponding to a first etch stop layer 12 in FIG. 5A. Conductive plates located at every other level can be patterned to include a laterally protruding portion. For example, the first conductive plate 10 includes a first laterally protruding portion 11, the third conductive plate 30 includes a second laterally protruding portion 31, and the fifth conductive plate 50 includes a third laterally protruding portion 51. The dotted surface in FIG. 6C represents a vertical plane that corresponds to the boundaries of the first, second, and third laterally protruding portions (11, 31, 51) that adjoin the rest of the first, third, and fifth conductive plates (10, 30, 50), respectively.

Figure 7:
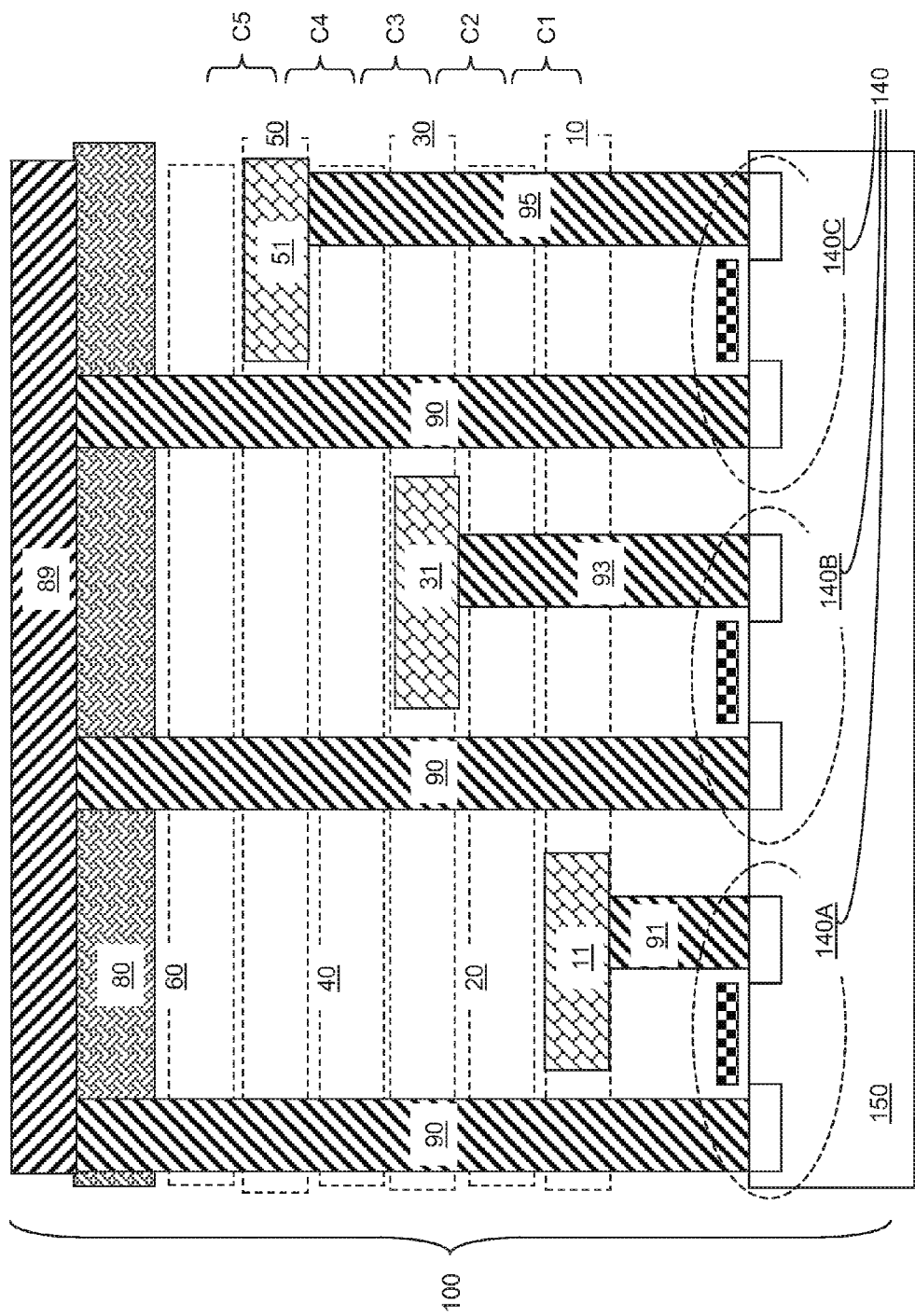
FIG. 7 is a vertical cross-sectional view of a sixth exemplary structure according to a seventh embodiment of the present invention.

Referring to FIG. 7, a sixth exemplary structure according to a seventh embodiment of the present invention is shown. The sixth exemplary structure can include the fifth exemplary structure. The sixth exemplary structure can be employed to form elements of a vertically stacked capacitor modules 100 in the second and third exemplary structures of FIGS. 2 and 3.

The sixth exemplary structure includes a plurality of switching devices 140, which can include field effect transistors formed on a semiconductor substrate 150. Conductive plates and node dielectrics can be formed as in the sixth embodiment to form first, third, and fifth conductive plates (10, 30, 50; See FIGS. 6A-6C). The first, third, and fifth conductive plates (10, 30, 50) include first, second, and third laterally protruding portions (11, 31, 51), respectively.

A first capacitor-side via structure 91 is formed to contact one node of a first switching device 140A. The first capacitor-side via structure 91 can be formed by forming a first via cavity in a material stack such that the first via cavity extends to a top surface of the first switching device 140A before forming the first conductive plate 10, and subsequently filling the first via cavity with a conductive material. By forming the first laterally protruding portion 11 of the first conductive plate 10 directly on a top surface of the first capacitor-side via structure 91, the first capacitor-side via structure 91 can contact a bottom surface of the first laterally protruding portion 11. A second capacitor-side via structure 93 is formed to contact one node of a second switching device 140B. A third capacitor-side via structure 95 is formed to contact one node of a third switching device 140C. The second and third capacitor-side via structures (93, 95) can be formed employing methods similar to those employed to form the first capacitor-side via structure 91. The second capacitor-side via structure 93 can contact a bottom surface of the second laterally protruding portion 31. The third capacitor-side via structure 95 can contact a bottom surface of the third laterally protruding portion 51. Additional capacitor-side via structures can be formed as needed.

The first, second, and third capacitor-side via structures (91, 93, 95) correspond to the electrical connection between a switching device 140 and a first electrode 110 in FIGS. 2 and 3. Each of the first, third, and fifth conductive plates (10, 30, 50) corresponds to a first electrode 110 in FIGS. 2 and 3. A second conductive plate 20, a fourth conductive plate 40, and a sixth conductive plate 60, which are laterally offset from the plane of the vertical cross-section in FIG. 7, are marked with dotted lines to represent the vertical positions relative to the switching devices 140 and the first, second, and third laterally protruding portions (11, 31, 51). Each of the second, fourth, and sixth conductive plates (20, 40, 60) corresponds to a second electrode 120 in FIGS. 2 and 3.

Within each vertically stacked capacitor module 100, first-type power-supply-side via structures 90 can be provided to contact the other node of each of the first, second, and third switching devices (140A, 140B, 140C). A first-type power-supply-side plate 89 can be provided to contact the first-type power-supply-side via structures 90 in the vertically stacked capacitor module 100 and other first-type power-supply-side via structures in other vertically stacked capacitor modules. The first-type power-supply-side plate 89 can be formed over a passivation layer 80, which can be the same as in the fifth and sixth embodiments. The first-type power-supply-side plate 89 embodies a first power supply side node, which is represented as "Global Vdd" in FIGS. 2 and 3.

Within each vertically stacked capacitor module 100, a second-type power-supply-side via structure (not shown) can be provided to contact the second, fourth, and sixth conductive plates (20, 40, 60). The second-type power-supply-side via structure can have the same structure as a second power-supply-side via structure 84 of the sixth exemplary structure in FIGS. 6A and 6B. A second-type power-supply-side plate (not shown) can be provided to contact the second-type power-supply-side via structure in the vertically stacked capacitor module 100 and other second-type power-supply-side via structures in other vertically stacked capacitor modules. The second-type power-supply-side plate can be formed over the passivation layer 80. For example, the second-type power-supply-side plate can have the same structure as the second power-supply-side plate 88 of the sixth exemplary structure in FIGS. 6A and 6B. The second-type power-supply-side plate embodies a second power supply side node, which is represented as "Global Vss" in FIGS. 2 and 3.

The combination of the first conductive plate 10, the second conductive plate 20, and a first node dielectric therebetween (not shown) constitute a first capacitor C1. The combination of the second conductive plate 20, the third conductive plate 30, and a second node dielectric therebetween (not shown) constitute a second capacitor C2. The combination of the third conductive plate 30, the fourth conductive plate 40, and a third node dielectric therebetween (not shown) constitute a third capacitor C3. The combination of the fourth conductive plate 40, the fifth conductive plate 50, and a fourth node dielectric therebetween (not shown) constitute a fourth capacitor C4. The combination of the fifth conductive plate 50, the sixth conductive plate 60, and a fifth node dielectric therebetween (not shown) constitute a fifth capacitor C5.

The combination of the first capacitor C1, the first capacitor-side via structure 91, and the first switching device 140A constitute a first-type capacitor module 4 in FIGS. 2 and 3. The combination of the second capacitor C2, the third capacitor C3, the second capacitor side via structure 93, and the second switching device 140B constitute a second-type capacitor module 8 in FIG. 2. The combination of the fourth capacitor C4, the fifth capacitor C5, the third capacitor side via structure 95, and the third switching device 140C constitute another second-type capacitor module 8 in FIG. 2.

Each of the switching devices 140 is electrically connected to the first power supply node on one end and one of the first, third, and fifth conductive plates (10, 30, 50) on the other end. During the operation of an assembly of vertically stacked capacitor modules 100, a first component, such as a first p-type field effect transistor "P1" in FIG. 4, in each switching device (140A, 140B, 140C) within a capacitor module is periodically turned off. While the first component is turned off, a leakage current through a capacitor within the capacitor module can trigger turning off of a second component, such as a second p-type field effect transistor "P2" in FIG. 4, within the capacitor module. The leaky capacitor within the capacitor module is electrically isolated from the first power supply node, thereby maintaining a leakage current in a power supply system including the first and second power supply nodes below a predetermined target level.

While the present invention has been particularly shown and described with respect to preferred embodiments thereof, it will be understood by those skilled in the art that the foregoing and other changes in forms and details can be made without departing from the spirit and scope of the present invention. It is therefore intended that the present invention not be limited to the exact forms and details described and illustrated, but fall within the scope of the appended claims.

What is claimed is:

1. A method of operating a semiconductor structure, said method comprising:
providing said semiconductor structure with an array of capacitor modules, wherein each of said capacitor modules comprises a capacitor and a switching device connected to a power supply node, said switching device including a first p-type field effect transistor and a second p-type field effect transistor that are connected in a parallel connection between said power supply node and a node of said capacitor that is present within a same capacitor module as said switching device; and
turning on said first p-type field effect transistor that is present within said switching device within a selected capacitor module among said array of capacitor modules, wherein a leakage current through said capacitor within said selected capacitor module triggers turning off said second p-type field effect transistor that is present within said selected capacitor module, whereby said capacitor within said selected capacitor module is electrically isolated from said power supply node after said first p-type field effect transistor within said selected capacitor module is turned off.

2. The method of claim 1, further comprising applying a signal pulse of a finite duration to a gate of said first p-type field effect transistor within said selected capacitor module, whereby said first p-type field effect transistor turns on.

3. The method of claim 1, wherein a sensor unit within said switching device within said selected capacitor module is configured to detect said leakage current, said sensor unit is configured to provide a voltage to a gate of said second p-type field effect transistor within said selected capacitor module, and said voltage is determined by said leakage current.

4. The method of claim 3, further comprising elevating a temperature of said capacitor within said selected capacitor module employing a resistor physically located adjacent to said capacitor within said selected capacitor module during a duration of a signal pulse, whereby said leakage current increases with said elevating of said temperature.

5. The method of claim 1, wherein said semiconductor structure is provided such that said switching device includes a sensor unit configured to detect said leakage current through said capacitor within said selected capacitor module.

6. The method of claim 5, further comprising providing a signal pulse of a finite duration to a gate of said first p-type field effect transistor within said selected capacitor module, employing a pulse generator.

7. The method of claim 6, further comprising raising a temperature of said capacitor within said selected capacitor module during said duration of said signal pulse employing a resistor provided within said sensor unit.

8. The method of claim 7, wherein said semiconductor structure is provided such that said resistor within said selected capacitor module is connected to said first p-type field effect transistor within said selected capacitor module in a series connection between said power supply node and another power supply node, and said gate of said first p-type field effect transistor is connected to said pulse generator.

9. The method of claim 1, wherein said semiconductor structure is provided such that a drain of said second p-type field effect transistor within said selected capacitor module, is connected directly to said power supply node, and a source of said second p-type field effect transistor is connected directly to said node of said capacitor within said selected capacitor module.

10. The method of claim 5, wherein said semiconductor structure is provided such that said sensor unit is configured to provide a voltage to a gate of said second p-type field effect transistor within said selected capacitor module, wherein said voltage is determined by said leakage current.

11. The method of claim 5, wherein said semiconductor structure is provided such that said sensor unit within said selected capacitor module comprises an even number of inverters in a series connection located between another node of said capacitor within said selected capacitor module and a gate of said second p-type field effect transistor within said selected capacitor module.

12. A method of operating a semiconductor structure, said method comprising:
providing said semiconductor structure with an array of capacitor modules, wherein each of said capacitor modules comprises a capacitor and a switching device connected to a power supply node; and
turning on a first component of said switching device within a selected capacitor module among said array of capacitor modules, wherein a leakage current through said capacitor within said selected capacitor module triggers turning off of a second component within said selected capacitor module, whereby said capacitor within said selected capacitor module is electrically isolated from said power supply node after said first component is turned off; and elevating a temperature of said capacitor within said selected capacitor module employing a resistor physically located adjacent to said capacitor within said selected capacitor module during a duration of a signal pulse that turns on said first component, whereby said leakage current increases with said elevating of said temperature.

13. The method of claim 12, wherein said switching device comprises a field effect transistor, as said second component, and a sensor unit configured to detect said leakage current, said sensor unit is configured to provide a voltage to a gate of said field effect transistor, and said voltage is determined by said leakage current.

14. The method of claim 12, wherein said first component is a first p-type field effect transistor, and said method further comprises providing said signal pulse to a gate of said first p-type field effect transistor employing a pulse generator.

15. A method of operating a semiconductor structure, said method comprising:

providing said semiconductor structure with an array of capacitor modules, wherein each of said capacitor modules comprises a capacitor and a switching device connected to a power supply node, said switching device includes a set of components comprising a first p-type field effect transistor and a sensor unit configured to detect a leakage current through said capacitor, said sensor unit comprising an even number of inverters in a series connection located between a node of said capacitor and a gate of a second p-type field effect transistor; and turning on said first p-type field effect transistor that is present within said switching device within a selected capacitor module among said array of capacitor modules, wherein said leakage current through said capacitor within said selected capacitor module triggers turning off of said second p-type field effect transistor that is present within said selected capacitor module, whereby said capacitor within said selected capacitor module is electrically isolated from said power supply node after said first p-type field effect transistor is turned off.

16. The method of claim 15, wherein a drain of said second p-type field effect transistor is connected directly to said power supply node, and a source of said second p-type field effect transistor is connected directly to another node of said capacitor within said selected capacitor module.

17. The method of claim 15, wherein said sensor unit is configured to provide a voltage to said gate of said second p-type field effect transistor, wherein said voltage is determined by said leakage current.

18. The method of claim 15, further comprising raising a temperature of said capacitor during a duration of a signal pulse employing a resistor provided within said sensor unit.

* * * * *